United States Patent
Bi et al.

(10) Patent No.: US 10,332,880 B2
(45) Date of Patent: *Jun. 25, 2019

(54) VERTICAL FIN RESISTOR DEVICES

(71) Applicant: International Business Machines Corporation, Armonk, NY (US)

(72) Inventors: Zhenxing Bi, Niskayuna, NY (US); Kangguo Cheng, Schenectady, NY (US); Peng Xu, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/807,751

(22) Filed: Nov. 9, 2017

(65) Prior Publication Data
US 2018/0097001 A1    Apr. 5, 2018

Related U.S. Application Data

(63) Continuation of application No. 15/282,272, filed on Sep. 30, 2016, now Pat. No. 10,002,868.

(51) Int. Cl.
*H01L 27/088* (2006.01)
*H01L 21/8234* (2006.01)
(Continued)

(52) U.S. Cl.
CPC .. *H01L 27/0886* (2013.01); *H01L 21/823431* (2013.01); *H01L 27/0629* (2013.01);
(Continued)

(58) Field of Classification Search
CPC . H01L 21/845; H01L 28/20; H01L 29/66545; H01L 27/1211; H01L 27/1203;
(Continued)

(56) References Cited

U.S. PATENT DOCUMENTS 6,582,987 B2   6/2003  Jun et al.
6,720,231 B2   4/2004  Fried et al.
(Continued)

FOREIGN PATENT DOCUMENTS

JP      8-125127    *  5/1994   ......... H01L 21/822

OTHER PUBLICATIONS

List of IBM Patents or Patent Applications Treated as Related.

*Primary Examiner* — Caridad Everhart
(74) *Attorney, Agent, or Firm* — Vazken Alexanian; Ryan, Mason & Lewis, LLP

(57) ABSTRACT

Semiconductor devices and methods are provided in which vertical fin resistor devices are integrally formed as part of a process flow for fabricating FinFET (Fin Field Effect Transistor) devices. For example, a semiconductor device includes a FinFET device and a vertical fin resistor device formed on a semiconductor substrate. The FinFET device includes a vertical semiconductor fin which includes a structural profile that is defined by dimensions of width W, height H, and length L. The vertical fin resistor device includes a vertical fin structure which is formed of a resistive material (e.g., polysilicon or amorphous silicon), and which has a structural profile that is defined by dimension of width W1, height H1, and length L1. The structural profiles of the vertical semiconductor fin of the FinFET device and the vertical fin structure of the vertical fin resistor device have at least one corresponding dimension that is substantially the same.

20 Claims, 30 Drawing Sheets

(51) Int. Cl.
  *H01L 29/49* (2006.01)
  *H01L 29/66* (2006.01)
  *H01L 29/51* (2006.01)
  *H01L 49/02* (2006.01)
  *H01L 27/06* (2006.01)
(52) U.S. Cl.
  CPC .......... *H01L 28/20* (2013.01); *H01L 29/4966* (2013.01); *H01L 29/517* (2013.01); *H01L 29/66545* (2013.01); *H01L 29/495* (2013.01)
(58) Field of Classification Search
  CPC ......... H01L 27/0629; H01L 21/823431; H01L 21/823418; H01L 21/823481; H01L 21/823487; H01L 21/0886; H01L 29/495; H01L 29/4966; H01L 27/0886
  See application file for complete search history.

(56) References Cited

U.S. PATENT DOCUMENTS

| | | | |
|---|---|---|---|
| 6,969,656 B2 | 11/2005 | Du et al. | |
| 7,064,413 B2 | 6/2006 | Fried et al. | |
| 8,703,557 B1* | 4/2014 | Cai | H01L 29/6681 |
| | | | 257/347 |
| 8,796,772 B2 | 8/2014 | Yeh et al. | |
| 8,816,436 B2 | 8/2014 | Cheng et al. | |
| 9,478,625 B1* | 10/2016 | Zang | H01L 21/823431 |
| 10,002,868 B2* | 6/2018 | Bi | H01L 27/0886 |
| 10,038,050 B2* | 7/2018 | Adusumilli | H01L 28/24 |
| 2003/0141569 A1 | 7/2003 | Fried et al. | |
| 2004/0159910 A1 | 8/2004 | Fried et al. | |
| 2012/0175749 A1 | 7/2012 | Haensch et al. | |
| 2013/0099317 A1* | 4/2013 | Xia | H01L 29/785 |
| | | | 257/348 |
| 2013/0105942 A1 | 5/2013 | Chen et al. | |
| 2013/0307076 A1 | 11/2013 | Cheng et al. | |
| 2014/0197456 A1 | 7/2014 | Wang et al. | |
| 2014/0252477 A1 | 9/2014 | Tseng et al. | |
| 2014/0273292 A1* | 9/2014 | Posseme | H01L 21/3065 |
| | | | 438/5 |
| 2015/0061076 A1 | 3/2015 | Cheng et al. | |
| 2015/0333057 A1* | 11/2015 | Hoentschel | H01L 21/02164 |
| | | | 257/379 |
| 2018/0019170 A1* | 1/2018 | Glass | H01L 29/1054 |
| 2018/0114828 A1* | 4/2018 | Adusumilli | H01L 28/24 |

\* cited by examiner

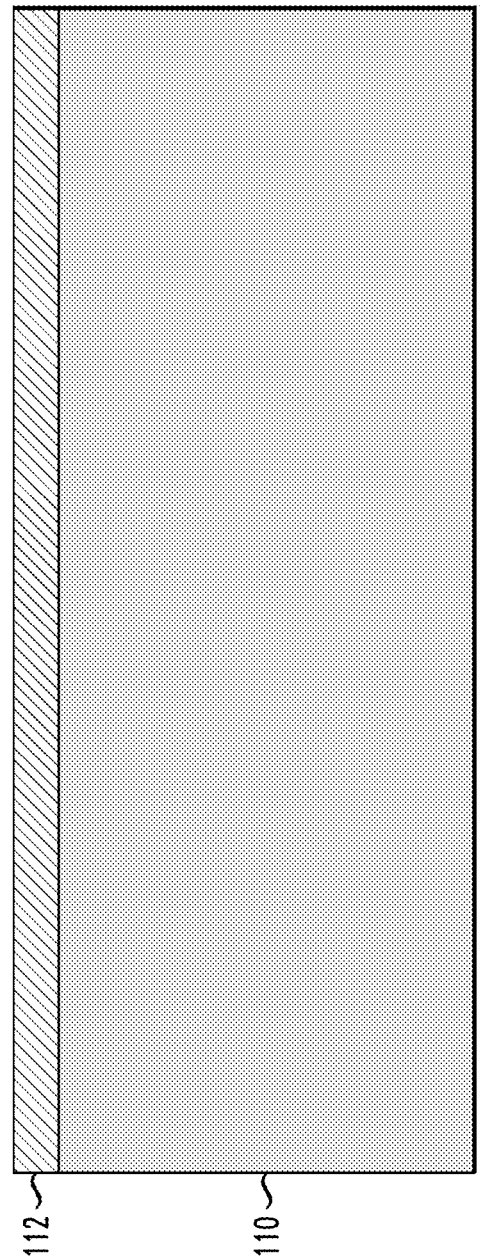

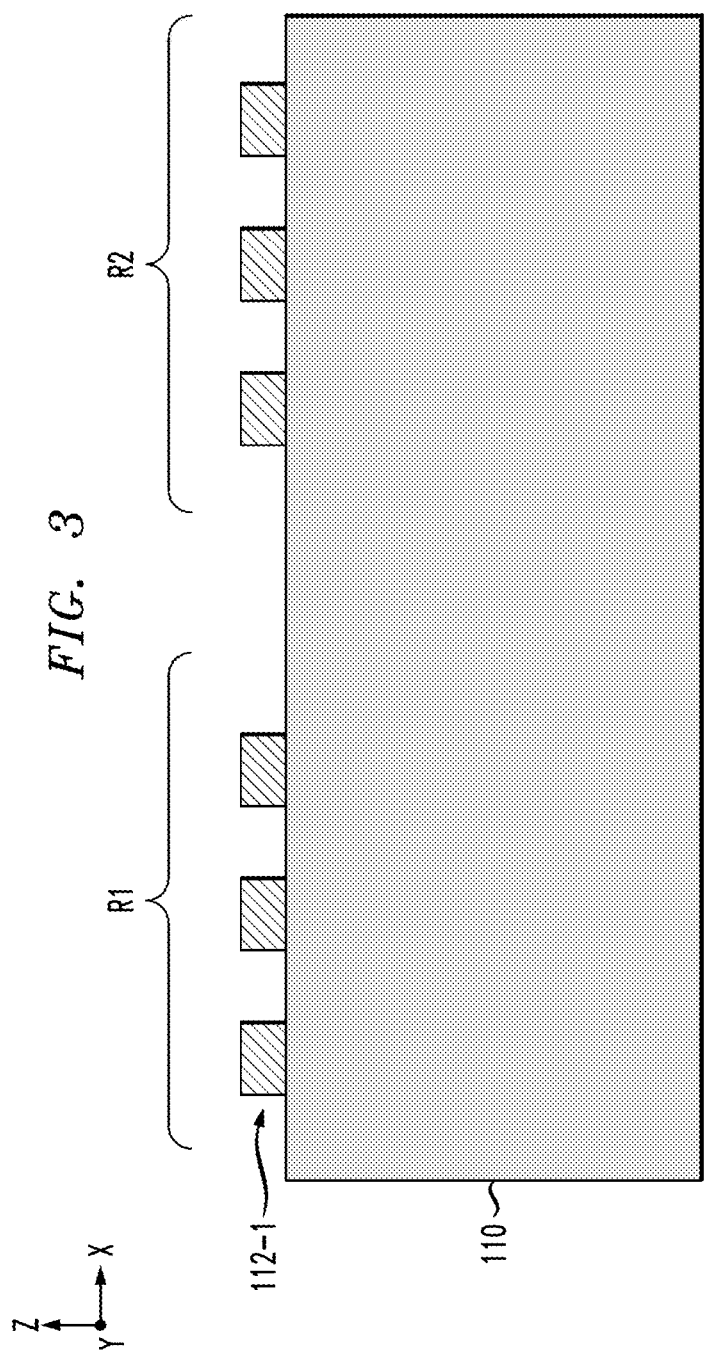

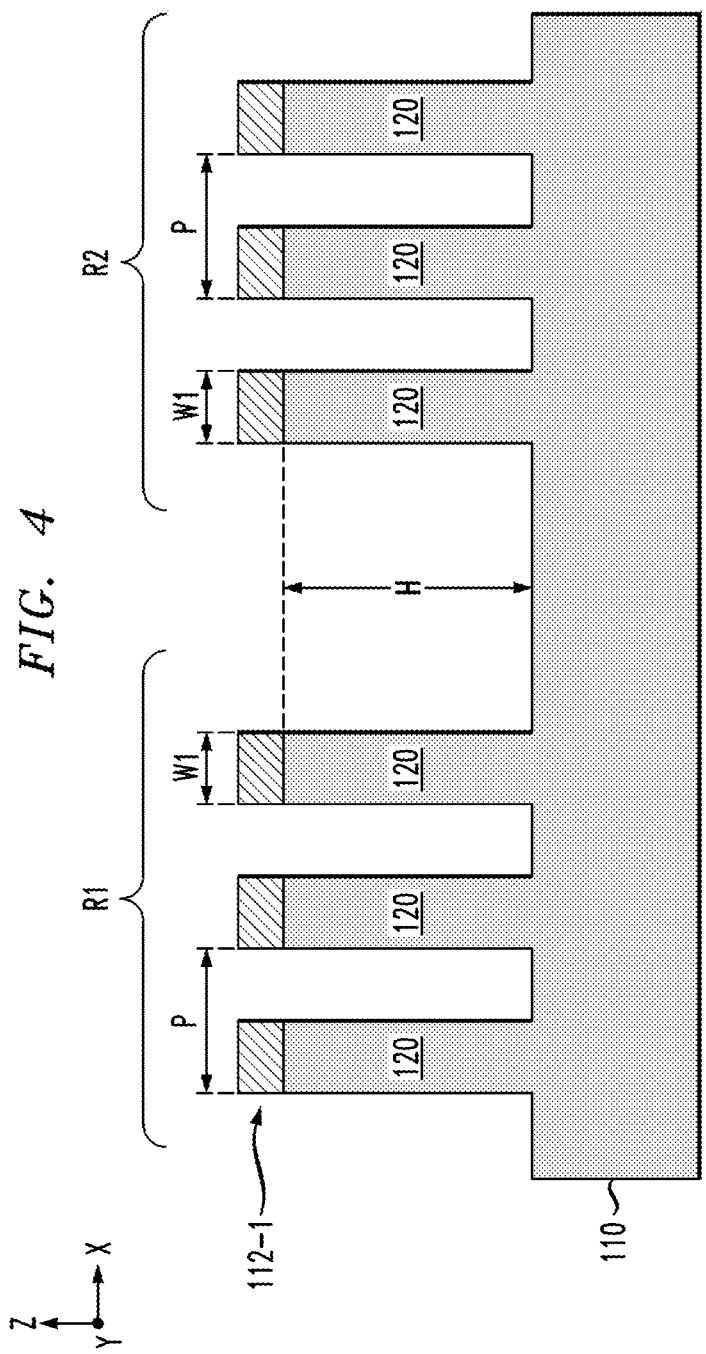

VERTICAL FIN RESISTOR DEVICES

TECHNICAL FIELD

This disclosure relates generally to semiconductor fabrication techniques and, in particular, to structures and methods for fabricating on-chip resistor devices.

BACKGROUND

On-chip resistor devices, such as polysilicon resistors, are utilized in semiconductor integrated circuits for various system-on-chip applications. However, the use of polysilicon resistors for state-of-the-art CMOS (complementary metal oxide semiconductor) technologies which implement high-k metal gate process flows is not feasible. While MOL (middle of the line) metallic resistors provide an alternative solution to polysilicon resistors, there are various issues associated with the use of metallic resistors. For example, metallic resistors provide low resistivity and occupy a large chip area (footprint). Moreover, the fabrication of integrated resistor devices using conventional CMOS technologies can require multiple deposition and lithographic masking steps, which is time consuming and expensive. In this regard, the amount and complexity of additional processing steps that are incorporated as part of a semiconductor process flow to fabricate integrated resistor devices should be minimized to reduce the fabrication costs and processing time for constructing semiconductor chips with integrated resistor devices. Furthermore, the footprint area occupied by integrated resistor devices should be minimized.

SUMMARY

Embodiments of the invention include semiconductor devices having vertical fin resistor devices that are integrated with FinFET (Fin Field Effect Transistor) devices, as well as methods for integrally forming vertical fin resistor devices as part of a process flow for fabricating FinFET devices.

For example, one embodiment of the invention includes a method for forming a semiconductor device. The method comprises: forming a plurality of vertical semiconductor fins on a semiconductor substrate, the plurality of vertical semiconductor fins comprising a first vertical semiconductor fin and a second vertical semiconductor fin; forming a first insulating layer over the semiconductor substrate to encapsulate the plurality of vertical semiconductor fins in the first insulating layer; etching down the second vertical semiconductor fin to form a trench opening in the first insulating layer; forming a vertical fin resistor device in the trench opening of the first insulating layer by filling the trench opening with a resistive material; forming a FinFET device which comprises a metal gate structure formed over a portion of the first vertical semiconductor fin, and first and second source/drain regions formed on portions of the first vertical semiconductor fin extending from opposite sides of the metal gate structure; forming a second insulating layer over the semiconductor substrate to cover the vertical fin resistor device and the FinFET device; and forming vertical device contacts in the second insulating layer to provide contacts to the first and second source/drain regions and the metal gate structure of the FinFET device, and to first and second end portions of the vertical fin resistor device.

Another embodiment includes a semiconductor device that comprises a FinFET device formed on a semiconductor substrate, and a vertical fin resistor device formed on the semiconductor substrate. The FinFET device comprises: a vertical semiconductor fin formed on the semiconductor substrate, wherein the vertical semiconductor fin comprises a structural profile that is defined by dimensions of width W, height H, and length L; a metal gate structure formed over a portion of the vertical semiconductor fin; and first and second source/drain regions formed on portions of the vertical semiconductor fin extending from opposite sides of the metal gate structure. The vertical fin resistor device comprises a vertical fin structure formed of a resistive material, wherein the vertical fin structure comprises a structural profile that is defined by dimension of width W1, height H1, and length L1. The structural profiles of the vertical semiconductor fin of the FinFET device and the vertical fin structure of the vertical fin resistor device have at least one corresponding dimension that is substantially the same.

Other embodiments will be described in the following detailed description of embodiments, which is to be read in conjunction with the accompanying figures.

BRIEF DESCRIPTION OF THE DRAWINGS

FIGS. 2 through 15 schematically illustrate a method for fabricating the semiconductor device of FIGS. 1A, 1B, and 1C, according to an embodiment of the invention, wherein:

FIG. 2 is a cross-sectional schematic side view of the semiconductor device at an intermediate stage of fabrication in which layer of dielectric material is formed on a semiconductor substrate;

FIG. 3 is a cross-sectional schematic side view of the semiconductor structure of FIG. 2 after patterning the layer of dielectric material to form a hard mask which is used to etch the semiconductor substrate;

FIG. 4 is a cross-sectional schematic side view of the semiconductor structure of FIG. 3 after patterning the semiconductor substrate using the etch mask to form a pattern of vertical semiconductor fins in a first device region and a second device region;

FIG. 5 is a cross-sectional schematic side view of the semiconductor structure of FIG. 4 after depositing a first layer of insulating material over the semiconductor structure and planarizing the first layer of insulating material down to the etch mask;

FIG. 6 is a cross-sectional schematic side view of the semiconductor structure of FIG. 5 after forming a photoresist mask with an opening that exposes the second device region and recessing the vertical semiconductor fins in the second device region to form a plurality of trenches in the first layer of insulating material;

FIG. 7 is a cross-sectional schematic side view of the semiconductor structure of FIG. 6 after removing the photoresist mask and depositing a layer of doped polysilicon material to fill the plurality of trenches in the first layer of insulating material with doped polysilicon material to form vertical fin resistor devices in the second device region;

FIG. 8 is a cross-sectional schematic side view of the semiconductor structure of FIG. 7 after planarizing the semiconductor structure down to the first layer of insulating material to remove the overburden doped polysilicon material;

FIG. 9 is a cross-sectional schematic side view of the semiconductor structure of FIG. 8 after recessing the first layer of insulating material down to a target level above the etched surface of the semiconductor substrate, and removing the remaining hard mask material from the upper surfaces of the vertical semiconductor fins in the first device region;

FIG. 10 is a cross-sectional schematic side view of the semiconductor structure of FIG. 9 after forming dummy gate structures over the vertical semiconductor fins in the first device region, and forming insulating spacer layers on the dummy gate structures in the first device region and on the vertical fin resistor devices in the second device region;

FIG. 11 is a schematic top plan view of the semiconductor structure shown in FIG. 10, wherein FIG. 10 is a schematic cross-sectional view of the semiconductor structure taken along line 10-10 in FIG. 11;

FIG. 12B is a schematic top plan view of the semiconductor structure shown in FIG. 12A, wherein FIG. 12A is a schematic cross-sectional view of the semiconductor structure taken along line 12A-12A in FIG. 12B;

FIG. 13 is a cross-sectional schematic side view of the semiconductor structure of FIG. 12A after forming a second layer of insulating material over the semiconductor structure;

FIG. 14B is a schematic top plan view of the semiconductor structure shown in FIG. 14A, wherein FIG. 14A is a schematic cross-sectional view of the semiconductor structure taken along line 14A-14A in FIG. 14B;

FIG. 15 is a cross-sectional schematic side view of the semiconductor structure of FIG. 14A after replacing the dummy gate structure with metal gate structures;

FIG. 16B is a schematic top plan view of the semiconductor structure shown in FIG. 16A, wherein FIG. 16A is a schematic cross-sectional view of the semiconductor structure taken along line 16A-16A in FIG. 16B.

FIGS. 18 and 19 schematically illustrate a method for fabricating a semiconductor device having vertical fin resistor devices that are integrated with FinFET devices, according to another embodiment of the invention, wherein:

FIG. 18 is a cross-sectional schematic side view of the semiconductor structure of FIG. 5 after forming a photoresist mask with an opening that exposes the second device region and partially recessing the vertical semiconductor fins in the second device region to form a plurality of trenches in the first layer of insulating material; and FIG. 19 is a cross-sectional schematic side view of the semiconductor structure of FIG. 18 after depositing and planarizing a layer of doped polysilicon material to fill the plurality of trenches in the first layer of insulating material with doped polysilicon material to form vertical fin resistor devices in the second device region, wherein a vertical height of the vertical fin resistor devices is less than a height of the first layer of insulating material.

FIGS. 20 and 21 schematically illustrate a method for fabricating a semiconductor device having vertical fin resistor devices that are integrated with FinFET devices, according to yet another embodiment of the invention, wherein:

FIG. 20 is a cross-sectional schematic side view of the semiconductor structure of FIG. 6 after laterally etching sidewalls of the trenches to widen the trench openings; and FIG. 21 is a cross-sectional schematic side view of the semiconductor structure of FIG. 20 after depositing and planarizing a layer of doped polysilicon material to fill the plurality of trenches in the first layer of insulating material with doped polysilicon material to form vertical fin resistor devices in the second device region, wherein a width of the vertical fin resistor devices is greater than a width of the vertical semiconductor fins in the first device region.

FIGS. 22 and 23 schematically illustrate a method for fabricating a semiconductor device having vertical fin resistor devices that are integrated with FinFET devices, according to another embodiment of the invention, wherein:

FIG. 22 is a cross-sectional schematic side view of the semiconductor structure of FIG. 20 after depositing a conformal layer of dielectric material to form a thin liner on exposed surfaces within the trenches; and FIG. 23 is a cross-sectional schematic side view of the semiconductor structure of FIG. 22 after depositing and planarizing a layer of doped polysilicon material to fill the plurality of trenches in the first layer of insulating material with doped polysilicon material to form vertical fin resistor devices in the second device region.

FIGS. 24 and 25 schematically illustrate a method for fabricating a semiconductor device having vertical fin resistor devices that are integrated with FinFET devices, according to yet another embodiment of the invention, wherein:

FIG. 24 is a cross-sectional schematic side view of the semiconductor structure of FIG. 6 after removing the photoresist mask and selectively depositing a layer of dielectric material on bottom surfaces of the trenches; and FIG. 25 is a cross-sectional schematic side view of the semiconductor structure of FIG. 24 after depositing and planarizing a layer of doped polysilicon material to fill the plurality of trenches in the first layer of insulating material with doped polysilicon material to form vertical fin resistor devices in the second device region.

DETAILED DESCRIPTION

Embodiments of the invention will now be described in further detail with regard to semiconductor devices having vertical fin resistor devices that are integrated with FinFET devices, as well as methods for integrally forming vertical fin resistor devices as part of a FEOL (front-end-of-line) process flow for fabricating FinFET devices. As explained in further detail below, semiconductor fabrication techniques according to embodiments of the invention enable vertical fin resistor devices to be readily fabricated using CMOS process modules of a FEOL process flow to construct FinFET devices. The exemplary semiconductor process flows described herein allow integration of vertical fin resistor devices with FinFET devices for technology nodes of 7 nm and beyond.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

Figure 1A:
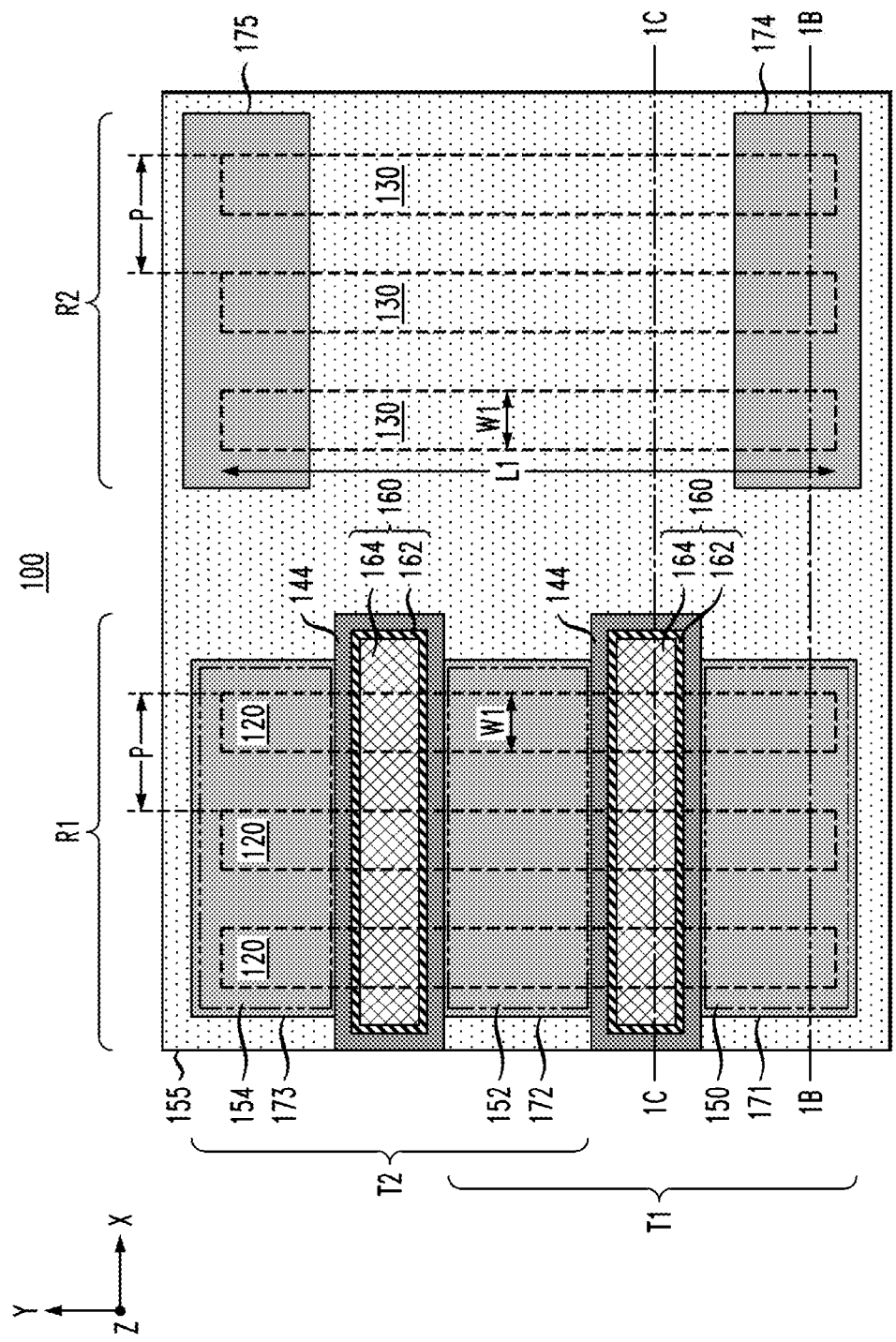
FIG. 1A is a schematic top plan view of a semiconductor device having vertical fin resistor devices that are integrated with FinFET devices, according to an embodiment of the invention.
Figure 1B:
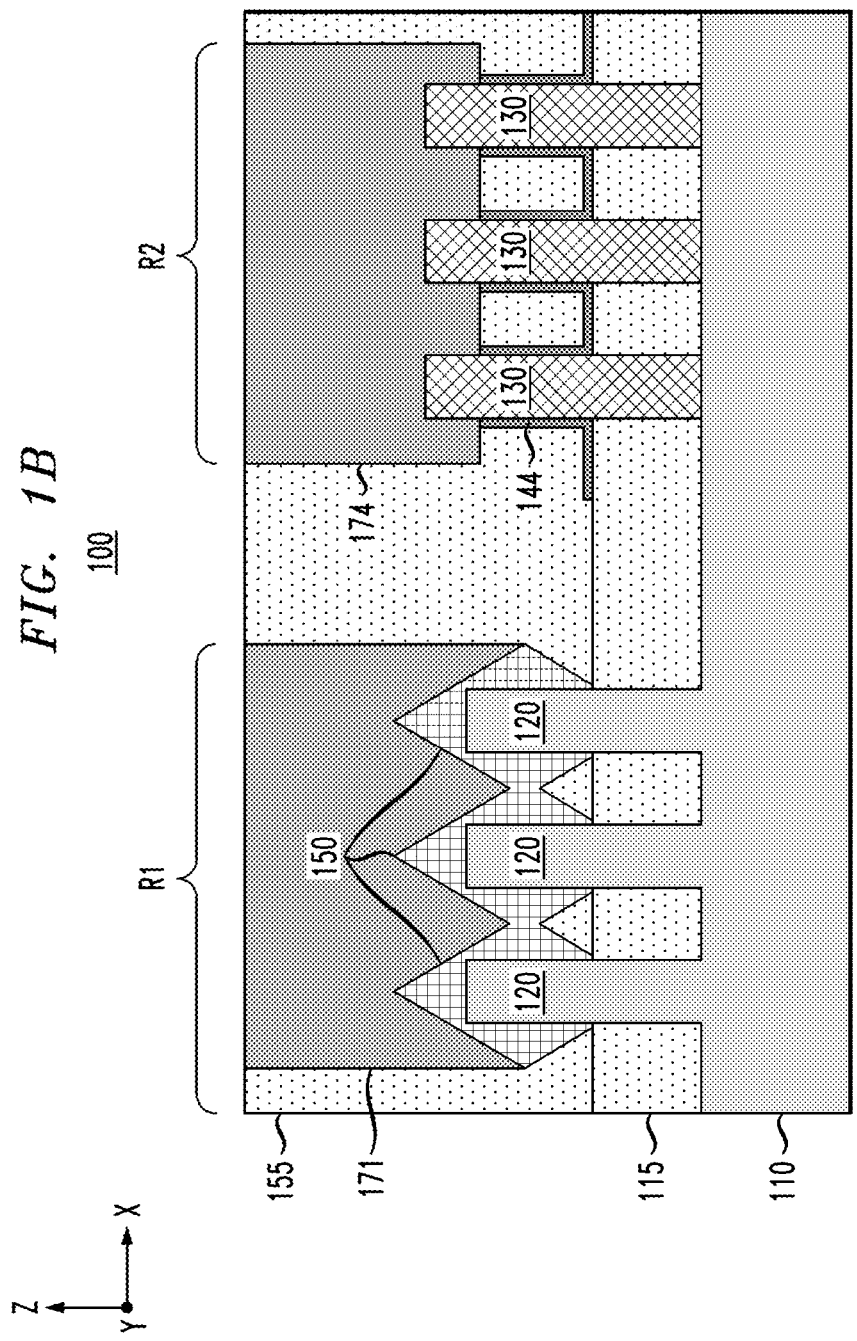
FIG. 1B is a schematic cross-sectional view of the semiconductor device of FIG. 1A taken along line 1B-1B in FIG. 1A.
Figure 1C:
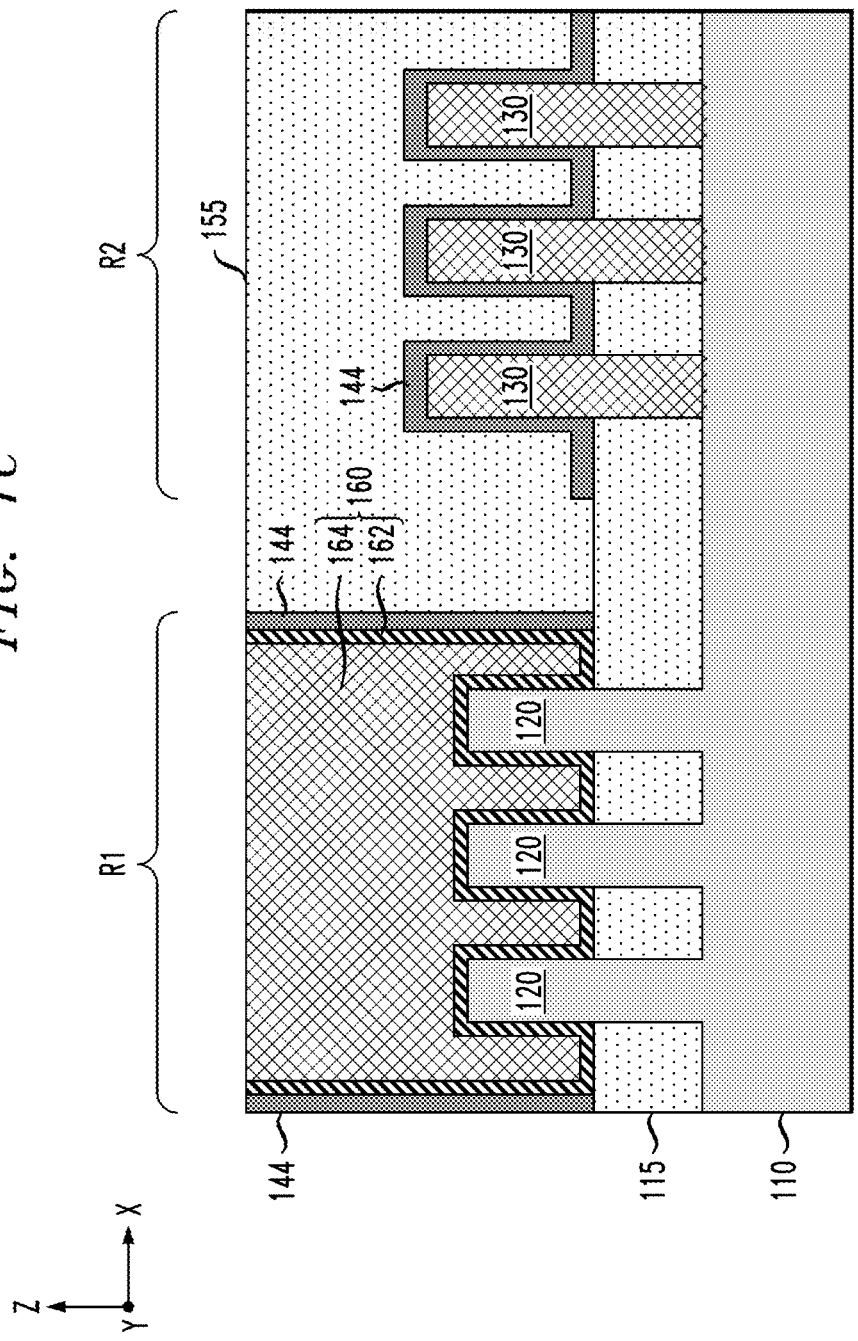
FIG. 1C is a schematic cross-sectional view of the semiconductor device of FIG. 1A taken along line 1C-1C in FIG. 1A.

FIGS. 1A, 1B and 1B are schematic views of a semiconductor device 100 having vertical fin resistor devices that are integrated with FinFET devices, according to an embodiment of the invention. FIG. 1A is a schematic top plan view of the semiconductor device 100, FIG. 1B is a schematic cross-sectional view of the semiconductor device of FIG. 1A taken along line 1B-1B in FIG. 1A, and FIG. 1C is a schematic cross-sectional view of the semiconductor device of FIG. 1A taken along line 1C-1C in FIG. 1A. More specifically, FIG. 1A is a schematic top plan view of the semiconductor device 100 in a X-Y plane, and FIGS. 1B and 1C are cross-sectional views of the semiconductor device 100 in a X-Z plane, as indicated by the respective XYZ Cartesian coordinates shown in FIGS. 1A, 1B, and 1C. It is to be understood that the term "vertical" or "vertical direction" or "vertical height" as used herein denotes a Z-direction of the Cartesian coordinates shown in the drawings, and the terms "horizontal," or "horizontal direction," or "lateral direction" as used herein denotes an X-direction and/or Y-direction of the Cartesian coordinates shown in the drawings.

As collectively shown in FIGS. 1A, 1B and 1C, the semiconductor device 100 comprises a substrate 110, a first insulating layer 115 (or lower insulating spacer), a second insulating layer 155 (e.g., a PMD (pre-metal dielectric) layer of a MOL layer), a plurality of vertical semiconductor fins 120 formed in a first region R1 (or FinFET device region) of the semiconductor device 100, and a plurality of vertical fin devices 130 formed in a second device region R2 (or vertical fin resistor device region) of the semiconductor device 100. As shown in FIG. 1A, the first device region R1 comprises first and second serially connected FinFET devices T1 and T2. Each FinFET device T1 and T2 comprises a metal gate structure 160 which is embedded in the second insulating layer 155 and formed over portions of each of the vertical semiconductor fins 120. As shown in FIGS. 1A and 1C, each metal gate structure 160 comprises a high-k metal gate stack structure 162 and a metal gate electrode layer 164, and an insulating spacer layer 144 disposed on the sidewalls of the metal gate structures 160. Each high-k metal gate stack structure 162 comprises, e.g., a thin conformal gate dielectric layer formed on a portion of the vertical semiconductor fin 120 and a thin conformal work function metal (WFM) layer that is formed over the conformal gate dielectric layer.

As shown in FIG. 1A, the first FinFET device T1 further comprises a first source/drain region 150 and a second source/drain region 152, and the second FinFET device T2 comprises a third source/drain region 154, wherein the second source/drain region 152 is shared by the first and second FinFET devices T1 and T2. In one embodiment, the source/drain regions 150, 152 and 154 comprise epitaxial semiconductor layers that are selectively grown on exposed portions of the vertical semiconductor fins 120 that extend past the insulating spacer layers 144 on the sidewalls of the metal gate structures 160. In particular, as shown in FIG. 1B, the first source/drain region 150 (as well as the second and third source/drain regions 152 and 154) comprises a plurality of diamond-shaped faceted epitaxial semiconductor layers which are selectively grown on the exposed portions of the vertical semiconductor fins 120 such that the diamond-shaped faceted epitaxial semiconductor layers merge to form a single source/drain region. It is to be understood that the term "source/drain region" as used herein means that a given source/drain region can be either a source region or a drain region, depending on the application or circuit configuration.

As further shown in FIGS. 1A and 1B, vertical source/drain contacts 171, 172, and 173 are formed in the second insulating layer 155 in contact with the respective source/drain regions 150, 152 and 154, and vertical device contacts 174 and 175 are formed in the second insulating layer 155 in contact with end portions of the vertical fin resistor devices 130. While not specifically shown in FIGS. 1A and 1B, the semiconductor device 100 would also include one or more vertical gate contacts formed in the second insulating layer 155 in contact with the metal gate electrode layers 164 of the metal gate structures 160. The vertical contacts 171, 172, 172, 174 and 175 may be considered MOL device contacts that are formed as part of the MOL layer of the semiconductor device 100 to provide vertical contacts to the FinFET devices T1 and T2 and the vertical fin resistor devices 130. Each vertical contacts 171, 172, 172, 174 and 175 may comprises a liner/barrier layer and a conductive via, as is known in the art.

The metal gate structures 160 and source/drain regions 150, 152, and 154 are electrically insulated from the substrate 110 by the first insulating layer 115. The portions of the vertical semiconductor fins 120 that are covered by the metal gate structures 160 between the source/drain regions comprise device channel segments of the FinFET devices T1 and T2. In the example embodiments discussed herein, each FinFET device T1 and T2 comprises three channel segments as each metal gate structure 160 is formed over a portion of the three vertical semiconductor fins 120. In other embodiments, FinFET devices can be formed with more or less than three channel segments.

In the example embodiment as shown in FIG. 1A, the vertical fin resistor devices 130 have a structural profile that is substantially the same as the vertical semiconductor fins 120, e.g., the same pitch P (spacing), the same length L1, the same width W1, and substantially the same height. In one embodiment of the invention, the vertical fin resistor devices 130 are formed of doped polysilicon material, or other similar materials. As explained in further detail below, in one embodiment of the invention, the vertical fin resistor devices 130 are formed by a process which comprises forming vertical semiconductor fins in the second device region R2 concurrently with forming the vertical semiconductor fins 120 in the first device region R1, followed by etching away the vertical semiconductor fins in the second device region R2 to form trenches in an insulating layer, and then filling the trenches with doped polysilicon material to form the vertical fin resistor devices 130. Essentially, with the process, the vertical semiconductor fins that are initially formed in the second device region R2 are replaced with the vertical fin resistor devices 130.

As shown in FIGS. 1B and 1C, a conformal insulating spacer layer 144 is formed over the vertical fin resistor devices 130 in the device region R2. As explained in further detail below, the conformal insulating spacer layer 144 is deposited and patterned at the same time as the insulating spacer layer 144 is formed over the dummy gate structures 140 prior to epitaxial growth of the source/drain regions 150, 152 and 154 in the first device region R1 to prevent growth of epitaxial material on the polysilicon material of the vertical fin resistor devices 130. In an alternative embodiment, epitaxial material can be grown on portions of the vertical fin resistor devices 130 to reduce contact resistance between upper portions of the vertical fin resistor devices 130 and first and second vertical device contacts 174 and 175 that are formed in the second insulating layer 155 in contact with the end portions of the vertical fin resistor devices 130.

In one example embodiment as shown in FIGS. 1A and 1B, first end portions of the vertical fin resistor devices 130 are commonly connected to the first vertical device contact 174, and second end portions of the vertical resistor devices 130 are commonly connected to the second vertical fin resistor devices 130. In this configuration, the three vertical fin resistor devices 130 (as shown in FIG. 1A) comprise three parallel-connected resistor segments that collectively form a single vertical fin resistor device connected between the first and second vertical device contacts 174 and 175.

The resistance of the vertical fin resistor devices 130 can be modulated using various methods. In general, the resistance of each vertical fin resistor device 130 depends on factors such as the resistivity ρ (μΩ-cm) of the material used to form the vertical fin resistor devices 130, the length L1 of the vertical fin resistor devices 130, and the cross-sectional area A=height (H)×width (W) of the vertical fin resistor devices 130 (where the cross-sectional area A is perpendicular to the direction of conducting current along the length L1 of the resistor devices). In one embodiment, the doping concentration of the polysilicon material used to form the vertical fin resistor devices 130 can be modulated to achieve a target resistivity of the vertical fin resistor devices 130 (e.g., higher doping concentration increases conductivity). Further, the number of parallel-connected resistor segment can be modified (e.g., more or less than three fin resistor segments as shown in FIG. 1A) to achieve a target resistance.

In another embodiment, the height of the vertical fin resistor devices 130 can be modified to achieve a target resistance. For example, for a given width W, reducing the height H of the vertical fin resistor devices 130 results in a decrease of the cross-sectional area A=(H)×(W) of the vertical fin resistor devices 130, which effectively results in an increase in the resistance of the vertical fin resistor devices 130. Methods for adjusting the height of the vertical fin resistor devices 130 will be explained in further detail below with reference to, e.g., FIGS. 18 and 19. Similarly, for a given height H, increasing the width of the vertical fin resistor devices 130 results in an increase of the cross-sectional area A=(H)×(W) of the vertical fin resistor devices 130, which effectively results in a decrease in the resistance of the vertical fin resistor devices 130. Methods for increasing the width of the vertical fin resistor devices 130 will be explained in further detail below with reference to, e.g., FIGS. 20 and 21.

In the example embodiment shown in FIGS. 1A, 1B and 1C, the vertical fin resistor devices 130 are formed in direct contact with a surface of the semiconductor substrate 110. In circumstances where the difference in resistance between the materials of the substrate 110 and the vertical fin resistor devices 130 is relatively large (e.g., the undoped material of the substrate 110 has a much higher resistance than the doped material of the vertical fin resistor devices 130), the current leakage into the substrate 110 from the vertical fin resistor devices 130 will be insubstantial. In circumstances where the difference in resistance between the materials of the substrate 110 and the vertical fin resistor devices 130 is relatively small, current leakage into the substrate 110 from the vertical fin resistor devices 130 may not be insubstantial. In this regard, in other embodiments of the invention, an insulating layer may be formed to electrically insulate the vertical fin resistor devices 130 from the substrate 110 using method that will be discussed in further detail below with reference to FIGS. 22, 23, 24 and 25.

Methods for fabricating the semiconductor device 100 shown in FIGS. 1A, 1B and 1C will now be discussed in further detail with reference to FIG. 2 through FIG. 17, which schematically illustrate the semiconductor device 100 at various stages of fabrication. To begin, FIG. 2 is a cross-sectional schematic side view of the semiconductor device at an intermediate stage of fabrication in which a layer of dielectric material 112 is formed on a semiconductor substrate 110. While the semiconductor substrate 110 is generically illustrated in FIG. 2, the semiconductor substrate 110 may comprise one of different types of semiconductor substrate structures. For example, in one embodiment, the semiconductor substrate 110 may comprise a bulk semiconductor substrate formed of, e.g., silicon, or other types of semiconductor substrate materials that are commonly used in bulk semiconductor fabrication processes such as germanium, silicon-germanium alloy, silicon carbide, silicon-germanium carbide alloy, or compound semiconductor materials (e.g. III-V and II-VI). Non-limiting examples of compound semiconductor materials include gallium arsenide, indium arsenide, and indium phosphide. In another embodiment, the semiconductor substrate 110 may comprise a SOI (silicon on insulator) substrate, which comprises an insulating layer (e.g., oxide layer) disposed between a base substrate layer (e.g., silicon substrate) and an active semiconductor layer (e.g., silicon layer, SiGe layer, III-V compound semiconductor layer, etc.) in which active circuit components (e.g., FinFET devices) are formed as part of a FEOL layer.

The layer of dielectric material 112 comprises silicon nitride (SiN) or any other dielectric material that is suitable for use hard etch mask. A next step in the illustrative fabrication process comprises patterning the layer of dielectric material 112 to form a hard mask that is used to etch vertical semiconductor fins in the surface of the semiconductor substrate 110. For example, FIG. 3 is a cross-sectional schematic side view of the semiconductor structure of FIG. 2 after patterning the layer of dielectric material 112 to form a hard mask 112-1. The layer of dielectric material 112 can be patterned using standard photolithography techniques. For example, a layer of photoresist material is deposited on top of the layer of dielectric material 112 and lithographically patterned (exposed and developed) to form a photoresist mask having a target pattern which is to be transferred to the layer of dielectric material 112. An etch process is then performed using the photoresist mask to etch exposed portions of the layer of dielectric material 112 down to the surface of the semiconductor substrate 110 and thereby form the hard mask 112-1. The etch process can be performed using a dry etch process such as RIE (reactive ion etching) or other etch processes with etching chemistries that are suitable to etch the layer of dielectric material 112.

Next. FIG. 4 is a cross-sectional schematic side view of the semiconductor structure of FIG. 3 after patterning the semiconductor substrate 110 using the hard mask 112-1 to form a pattern of vertical semiconductor fins 120 in the first device region R1 and the second device region R2. The semiconductor substrate 110 can be etched using a directional RIE etch (anisotropic etch) with an etch chemistry that is suitable to etch the semiconductor material of the semiconductor substrate 110 selective to the hard mask 112-1. The resulting vertical semiconductor fins 120 are shown to have a width W1 and a height H1. In one embodiment, the width W1 is in a range of about 5 nm to about 20 nm, and the height H1 is in a range of about 50 nm to about 150 nm. Further, the resulting pattern of vertical semiconductor fins 120 in each device region R1 and R2 comprises a pitch P, wherein in one embodiment, the pitch P is in a range of about 20 nm to about 60 nm.

Figure 5:
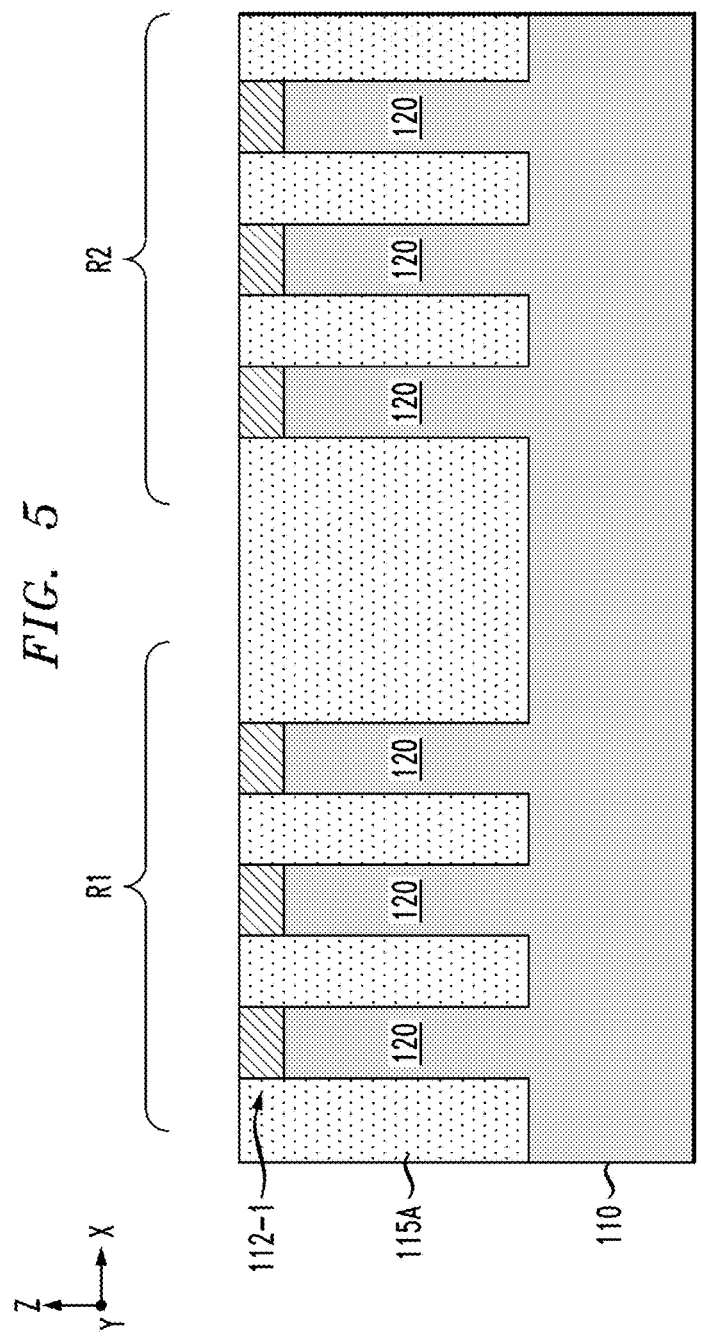

A next phase of the semiconductor process flow comprises replacing the vertical semiconductor fins 120 in the second device region R2 with doped polysilicon material to form vertical fin resistor devices in the second device region R2, using a process flow as schematically illustrated in FIGS. 5 through 8. For example, FIG. 5 is a cross-sectional schematic side view of the semiconductor structure of FIG. 4 after depositing a first layer of insulating material 115A over the semiconductor structure and planarizing the first layer of insulating material 115A down to the etch mask 112-1. The first layer of insulating material 115A may comprise any suitable dielectric material that is commonly utilized in FEOL process technologies including, but not limited to, silicon oxide (e.g. SiO2), silicon nitride (e.g., (Si3N4), hydrogenated silicon carbon oxide (SiCOH), SiCH, SiCNH, or other types of silicon-based low-k dielectrics (e.g., k less than about 4.0), porous dielectrics, or known ULK (ultra-low-k) dielectric materials (with k less than about 2.5). The first insulating layer 115A may be deposited using known deposition techniques, such as, for example, ALD (atomic layer deposition), CVD (chemical vapor deposition) PECVD (plasma-enhanced CVD), or PVD (physical vapor deposition), or spin-on deposition.

Figure 6:
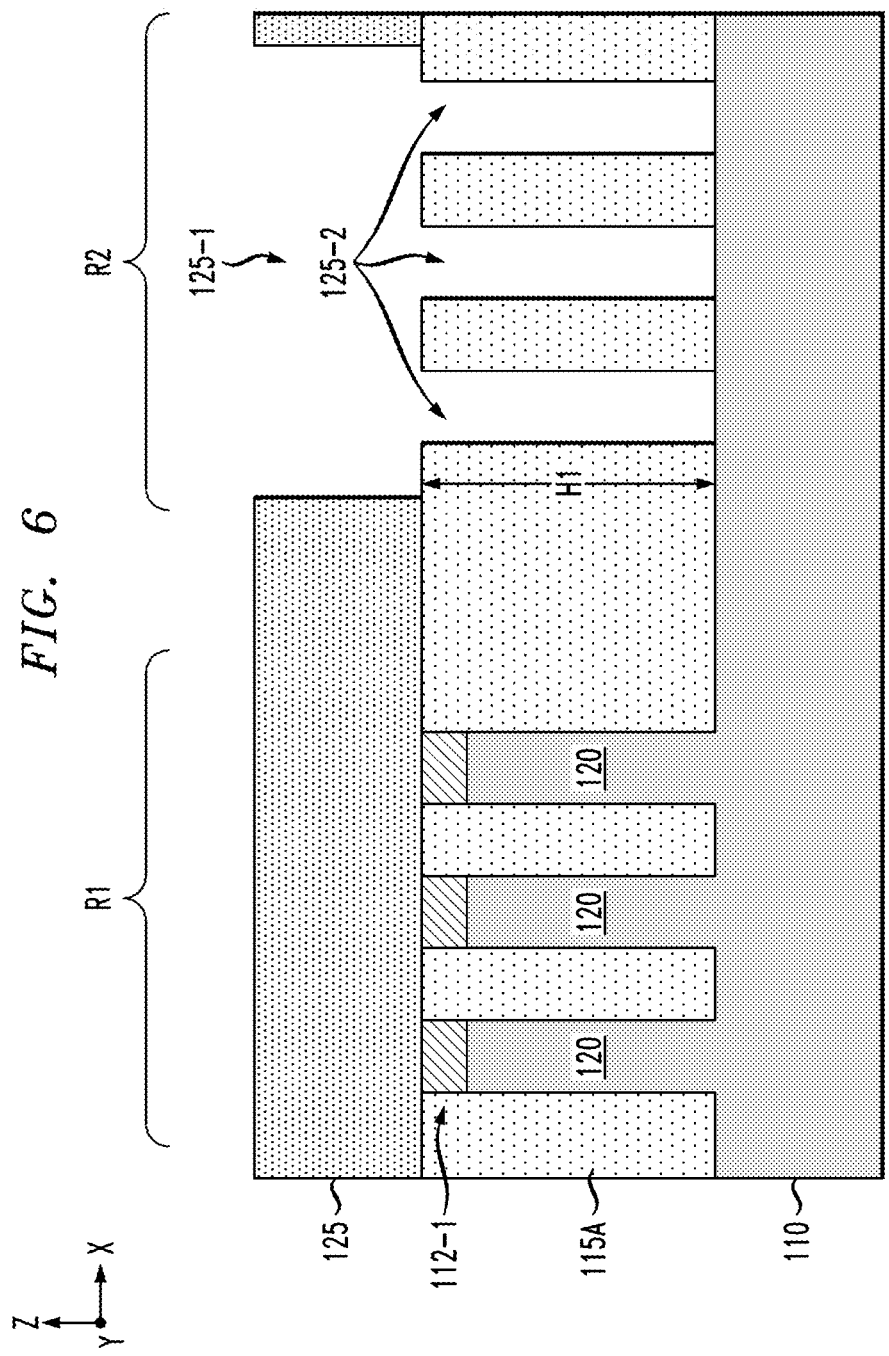

Next, FIG. 6 is a cross-sectional schematic side view of the semiconductor structure of FIG. 5 after (i) forming a photoresist mask 125 with an opening 125-1 that exposes the second device region R2, (ii) etching away the portion of the hard mask 112-1 in the second device region R2 to expose the upper surfaces of the vertical semiconductor fins 120 in the second device region R2, and (iii) etching down the vertical semiconductor fins 120 in the second device region R2 to form a plurality of trenches 125-2 in the first layer of insulating material 115A. The hard mask 112-1 can be removed by a wet etch process which is selective to the first layer of insulating material 115A, and the vertical semiconductor fins 120 in the second device region R2 can be removed by dry etching or wet etching the exposed semiconductor material with an etch chemistry that is suitable to etch the semiconductor material of the vertical semiconductor fins selective to the first layer of insulating material 115A. With this process, the vertical semiconductor fins 120 in the first device region R1 are protected by the photoresist mask 125 from being etched, while the vertical semiconductor fins 120 in the second device region R2 are etch away through the opening 125-1 of the photoresist mask 125.

In one example embodiment as shown in FIG. 6, the vertical semiconductor fins 120 in the second device region R2 are completely removed whereby the bottom of the trenches 125-2 are substantially level with the bottom of the first layer of insulating material 115A. In other embodiments, the semiconductor fin etch process may terminate slightly above or below the bottom level of the first layer of insulating material 115A, depending on the ability to control the etch process. Further, it may be desirable to purposefully etch the silicon material to a level above or below the bottom level of the first layer of insulating material 115A, depending on the application. For example, as explained in further detail below with reference to FIGS. 18 and 19, the semiconductor fin recess may terminate at some level above the bottom level of the first layer of insulating material 115A so as to form shorter vertical fin resistor devices which provide increased resistance.

Figure 7:
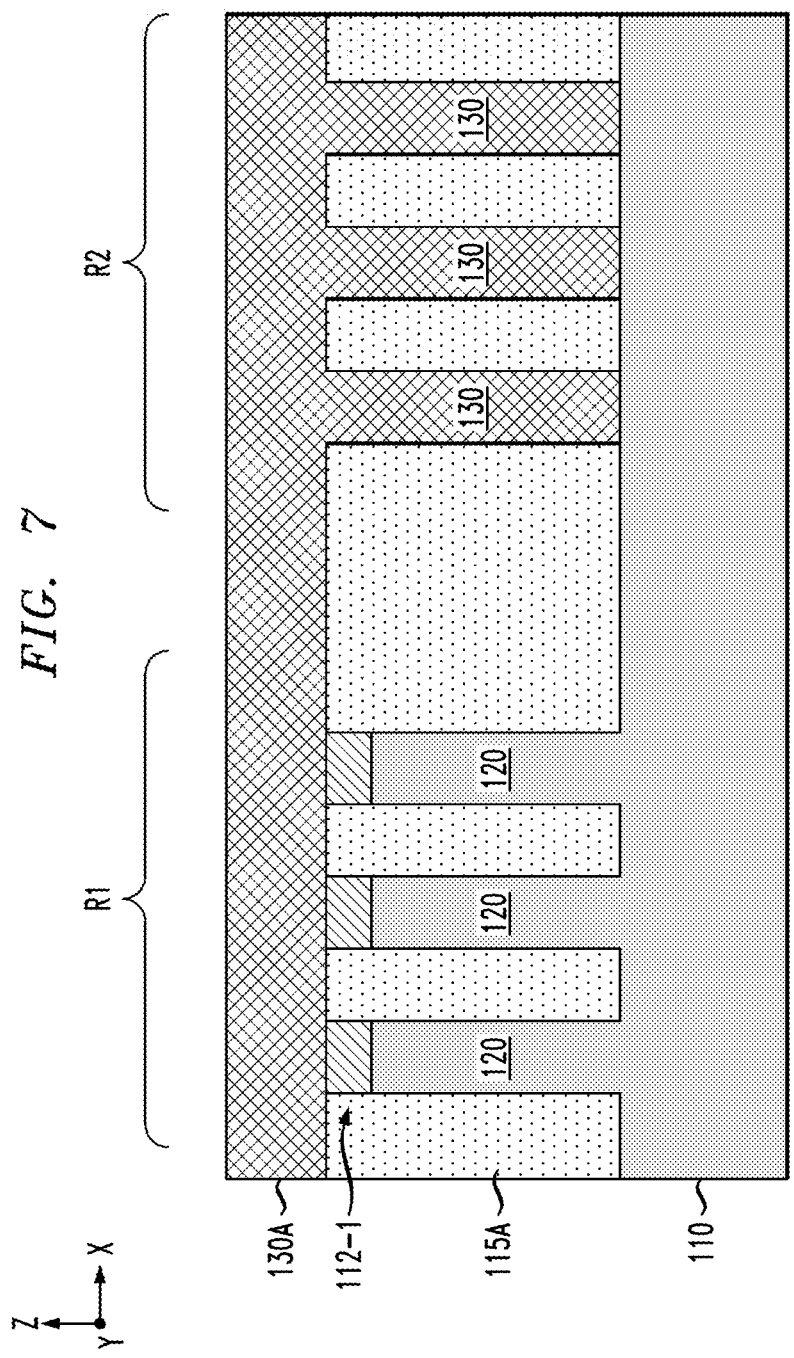
Figure 8:
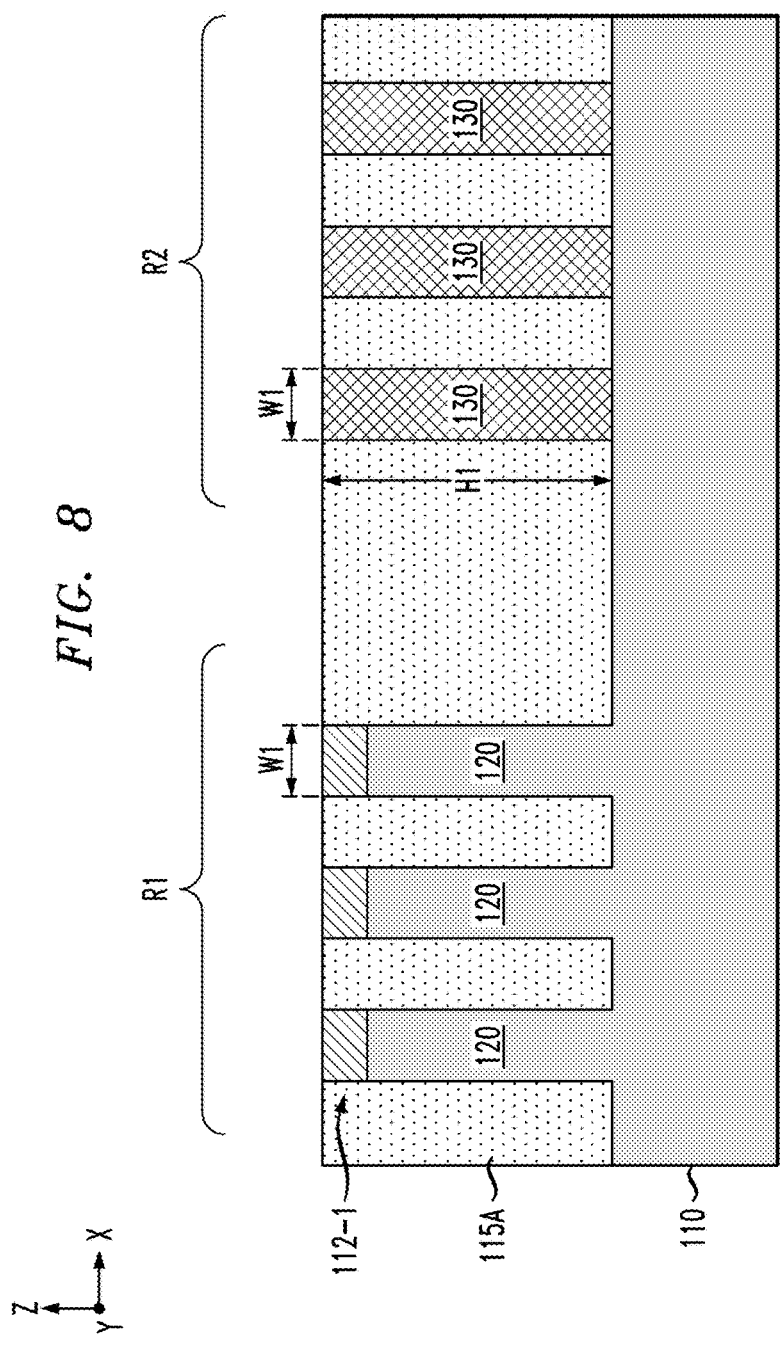

Next, FIG. 7 is a cross-sectional schematic side view of the semiconductor structure of FIG. 6 after removing the photoresist mask 125 and depositing a layer of doped polysilicon material 130A to fill the plurality of trenches 125-2 in the first layer of insulating material 115A with doped polysilicon material. Further, FIG. 8 is a cross-sectional schematic side view of the semiconductor structure of FIG. 7 after planarizing the semiconductor structure down to the first layer of insulating material 115A to remove the overburden doped polysilicon material 130A and form the vertical fin resistor devices 130 in the second device region R2. The doped polysilicon material 130A comprises a polycrystalline silicon material that is deposited using known methods such as CVD, physical vapor deposition (PVD), electro-chemical deposition, and other suitable deposition methods. The doping of the polysilicon material is performed during the deposition process by the addition of, e.g., phosphine, arsine, or diborane into the environment. The overburden polysilicon material 130A can be removed using a standard CMP (chemical mechanical polish) process. The resulting vertical fin resistor devices 130 in the second device region R2 are formed with a width W1 that is substantially the same as the width W1 of vertical semiconductor fins 120 in the first device region R1, and a height H1 which is substantially the same as the thickness of the planarized first layer of insulating material 115A.

Figure 9:
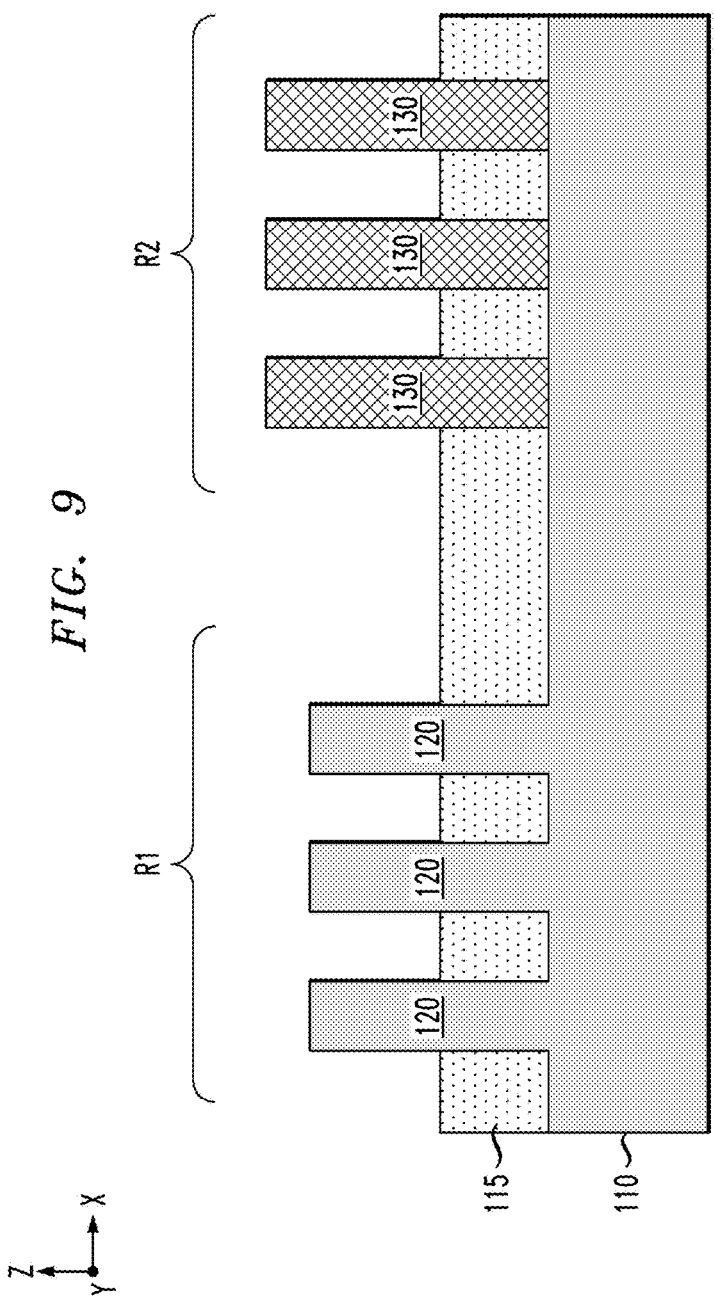

FIG. 9 is a cross-sectional schematic side view of the semiconductor structure of FIG. 8 after recessing the first layer of insulating material 115A down to a target level above the etched surface of the semiconductor substrate 110, and removing the remaining material of the hard mask 112-1 material from the upper surfaces of the vertical semiconductor fins 120 in the first device region R1. The recessing of the first layer of insulating material 115A results in the formation of the lower insulating spacer 115 (or lower shallow trench isolation region). With this process, the first layer of insulating material 115A is etched highly selective (e.g., greater than 10:1) to the material of the vertical semiconductor fins 120 and vertical fin resistors 130. The etch process can be performed using wet etch process with an etch chemistry that is configured to isotropically etch the first layer of insulating material 115A highly selective to the material of the vertical semiconductor fins 120 and vertical fin resistor devices 130. Alternatively, a low plasma etch process can be used to etch the first layer of insulating material 115A highly selective to the material of the vertical semiconductor fins 120 and the vertical fin resistor devices 130. The hard mask 112-1 can be removed using a wet or dry etch process with an etch chemistry that is selective to the lower insulating spacer 115 and the vertical semiconductor fins 120 and the vertical fin resistor devices 130.

Figure 10:
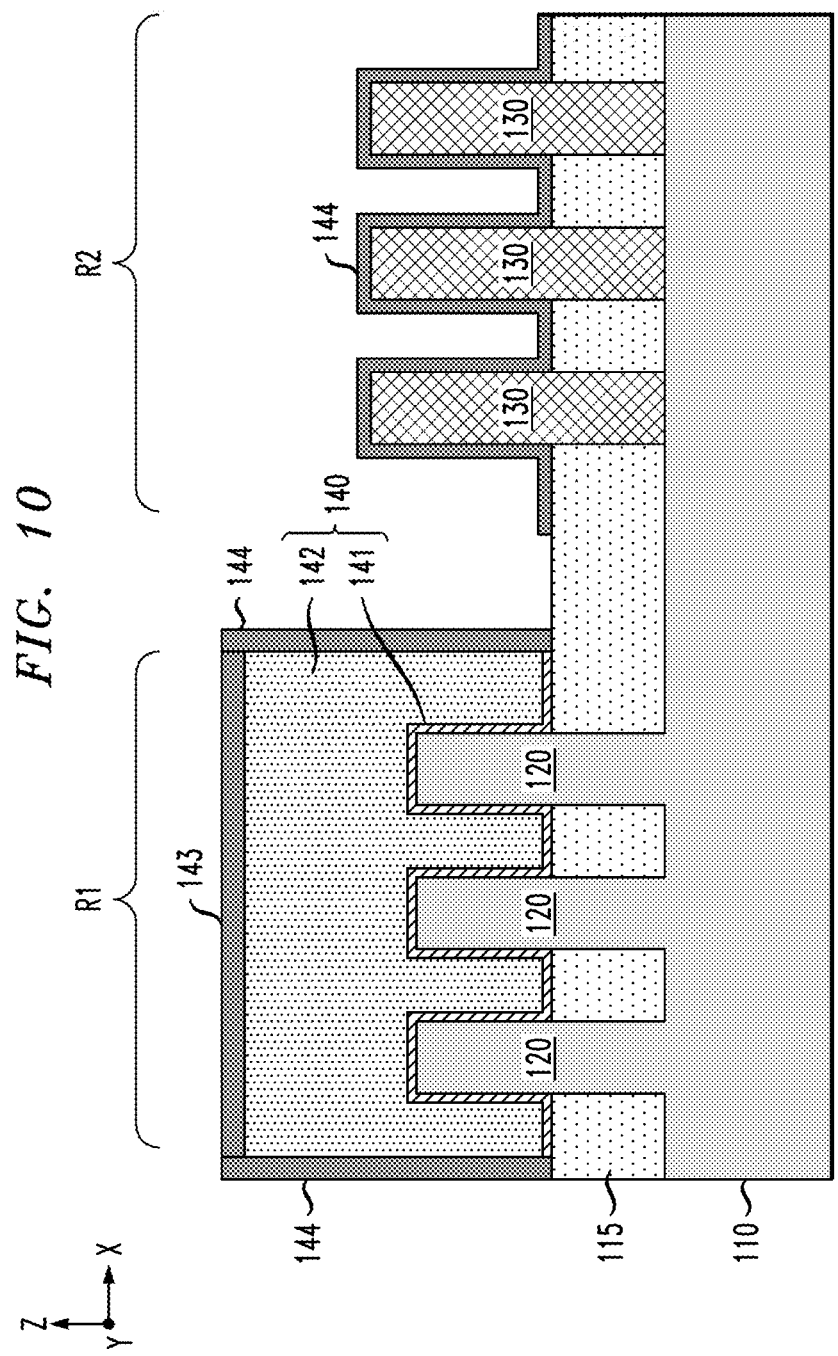
Figure 11:
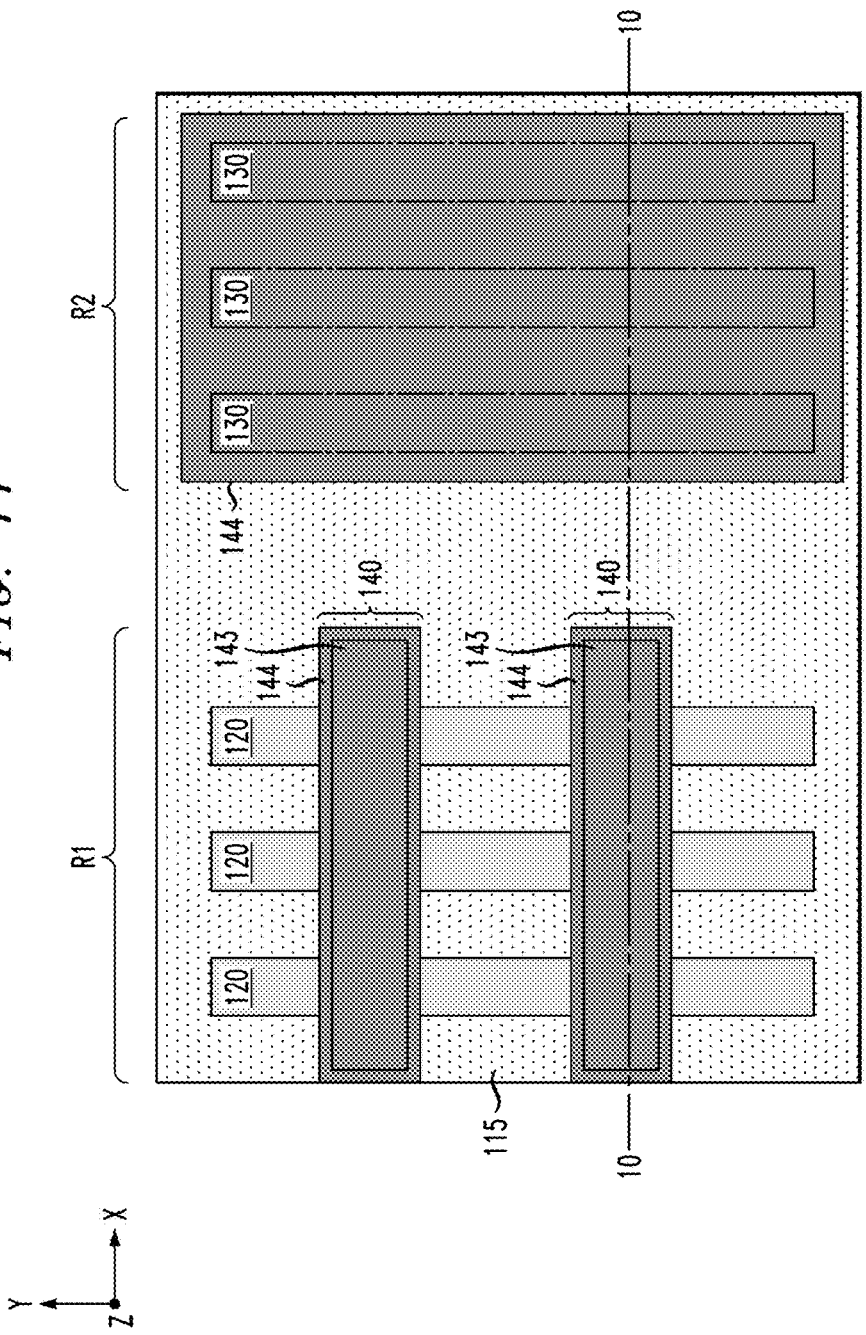

A next phase of the exemplary fabrication process comprises forming dummy gate structures in the first device region R1, as shown in FIGS. 10 and 11. In particular, FIG. 10 is a cross-sectional schematic side view of the semiconductor structure of FIG. 9 after forming dummy gate structures 140 over portions of the vertical semiconductor fins 120 in the first device region R1. FIG. 11 is a schematic top plan view of the semiconductor structure shown in FIG. 10, which shows two dummy gate structures 140 formed over portions of the vertical semiconductor fins 120. FIG. 10 is a schematic cross-sectional view of the semiconductor structure taken along line 10-10 in FIG. 11. As shown in FIG. 10, each dummy gate structure 140 comprises a thin conformal dummy oxide layer 141 formed on portions of the vertical semiconductor fins 120, and a dummy gate poly layer 142. Each dummy gate structure 140 is encapsulated in layer of dielectric material which comprises a gate hard mask layer 143 on an upper surface of the dummy gate structure 140 and an insulating spacer layer 144 on sidewalls surfaces of the dummy gate structure 140. The dummy oxide layer 141 facilitates selective removal of the dummy gate poly layer 142 in a subsequent RMG process.

The dummy gate structures 140 can be formed using various techniques known in the art. For example, a conformal oxide layer (e.g., silicon oxide) is deposited over the entire surface of the semiconductor structure of FIG. 9, followed by deposition and planarization of a layer of polysilicon (or alternatively, amorphous silicon) over the entire surface of the semiconductor structure of FIG. 9. A layer of dielectric material such as SiN or SiBCN is then deposited over the planarized layer of polysilicon and patterned to form an etch hard mask layer 143 (FIG. 11), which is used to etch away portions of the polysilicon and silicon oxide layers that are exposed through the etch hard mask layer 143 and thereby form the dummy gate structures 140 over target regions of the vertical semiconductor fins 120 where the vertical FinFET devices are to be formed in the first device region R1. After patterning the dummy gate structures 140, a conformal layer of dielectric material 144 (e.g., SiBCN)) is deposited over the entire surface of the semiconductor structure and patterned to form the insulating spacer layers 144 on the sidewalls of the dummy gate structures 140 in the first device region R1 and over the exposed portions of the vertical fin resistor devices 130 in the second device region R2.

For example, the conformal layer of dielectric material 144 is etched by forming a photoresist mask to cover the second device region R2, while exposing the first device region R1, followed by an etch process to remove the dielectric material 144 from the vertical semiconductor fins 120 in the first device region R1. With this etch process, the layer of dielectric material 144 on top of the dummy gate structures 140 is removed, thereby exposing the underlying etch hard mask layers 143 on top of the dummy gate structures 140, while the insulating spacer layer 144 on the sidewalls of the dummy gate structures 142 remain to serve as sidewall spacers. The insulating spacer layer 144 on the vertical fin resistor devices 130 is maintained to protect the vertical fin resistor devices 130 during a subsequent epitaxy process in which the epitaxial source/drain regions 150, 152 and 154 are epitaxially grown on the exposed surfaces of the vertical semiconductor fins 120, as schematically shown in FIGS. 12A and 12B.

Figure 12A:
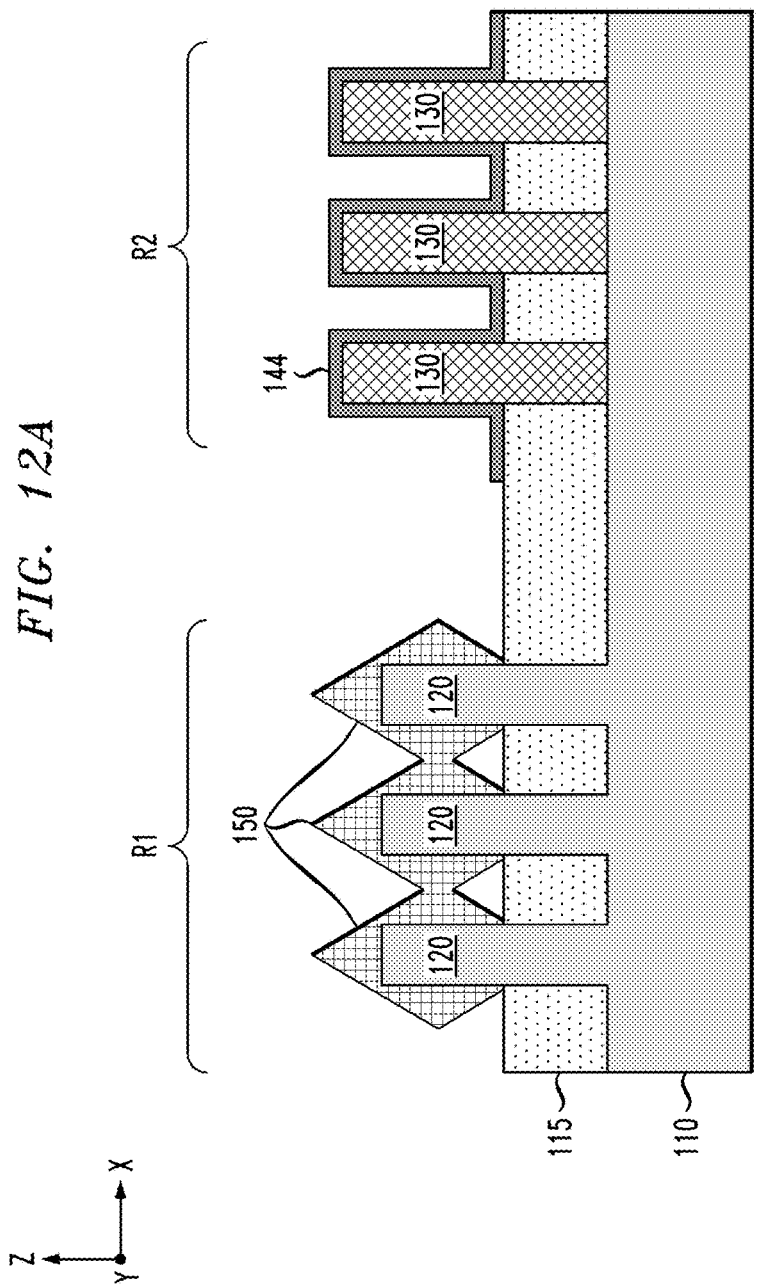
FIG. 12A is a cross-sectional schematic side view of the semiconductor structure of FIG. 11 after growing epitaxial source/drain regions on exposed portions of the vertical semiconductor fins in the first device region.
Figure 12B:
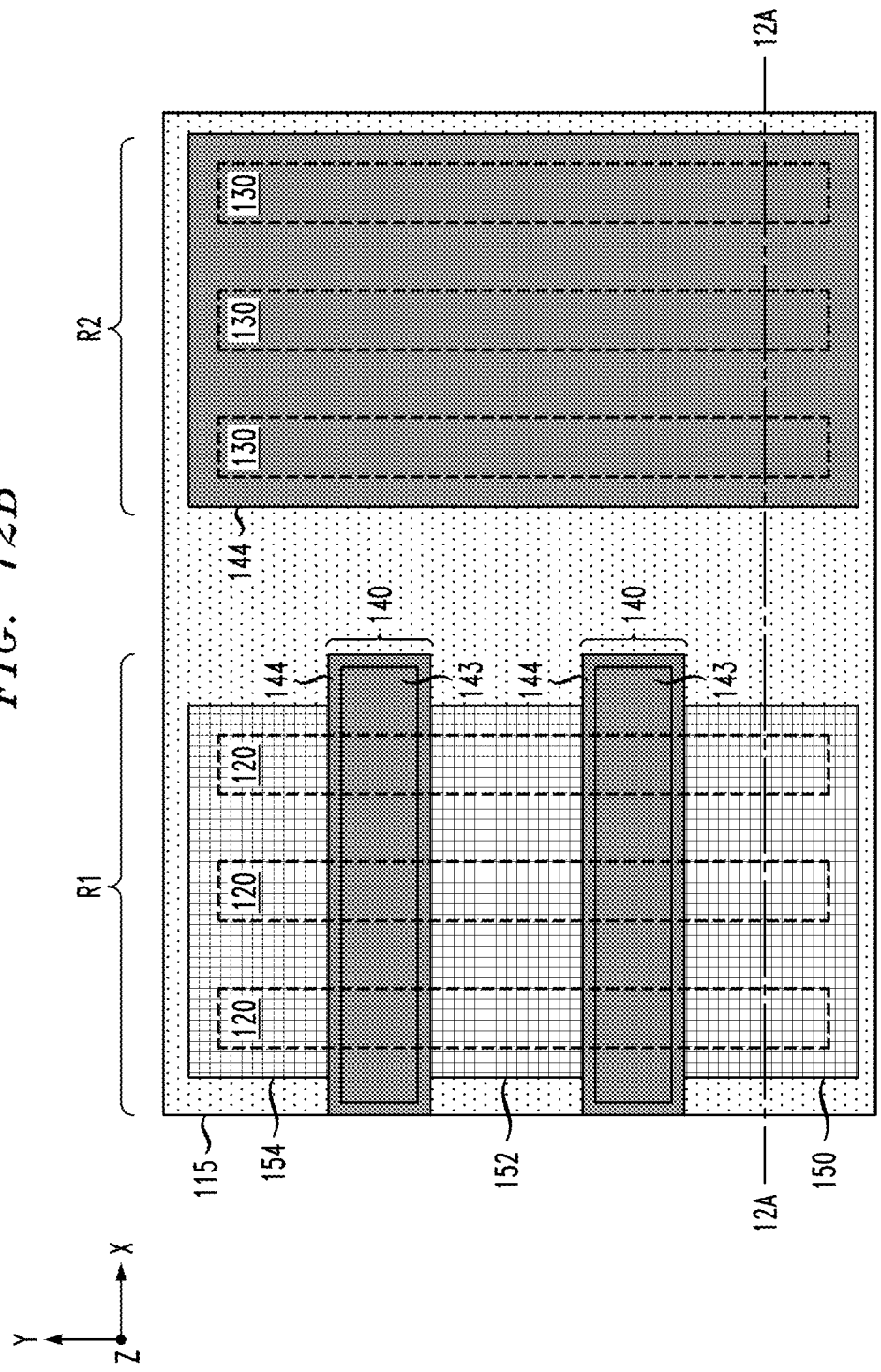

More specifically, FIG. 12A is a cross-sectional schematic side view of the semiconductor structure of FIG. 11 after growing the epitaxial source/drain regions (e.g., source/drain region 150) on exposed portions of the vertical semiconductor fins 120 in the first device region R1, and FIG. 12B is a schematic top plan view of the semiconductor structure shown in FIG. 12A, wherein FIG. 12A is a schematic cross-sectional view of the semiconductor structure taken along line 12A-12A in FIG. 12B. As specifically shown in FIG. 12B, the source/drain regions 150, 152, and 154 are grown on the exposed portions of the vertical semiconductor fins 120 that are not covered by the dummy gate structures 140. As shown in FIG. 12A, the source/drain regions (e.g., source/drain region 150) comprise diamond-shaped "faceted" source/drain regions that are selective grown on the exposed portions of the semiconductor fins 120 on each side of the dummy gate structures 140.

In one embodiment of the invention, the faceted source/drain regions 150, 152, and 154 are formed by epitaxially growing doped semiconductor layers (e.g., doped SiGe) on the exposed portions of the semiconductor fins 120 using known techniques in which epitaxial material is selectively grown on the exposed surfaces of the vertical semiconductor fins 120 and not on the surfaces of the insulating material layers (e.g., layers 115, 144). For example, the epitaxial source/drain regions 150, 152, and 154 can be epitaxially grown using known methods such as CVD, MOCVD (metal-organic CVD), LPCVD (Low Pressure CVD), MBE (molecular beam epitaxy), VPE (vapor-phase epitaxy), or other known epitaxial growth techniques which are suitable for the given process flow. The type of epitaxial semiconductor material that is used to form the source/drain regions 150, 152, and 154 will vary depending on various factors including, but are not limited to, the type of material of the vertical semiconductor fin 120, the device type (e.g., n-type or p-type) of the FinFET devices T1 and T2, etc.

With the epitaxy process, the epitaxial growth of the semiconductor material on the exposed surfaces of the individual semiconductor fins 120 can merge to form a single source/drain region contact, as shown in FIG. 12A. For example, the process conditions of the epitaxy process can be adjusted such that a growth rate on a surface with a (100) crystallographic orientation is significantly higher than the growth rate on surfaces with (110) or (111) crystallographic orientations. In this regard, the growth rate on the sidewall surfaces of the semiconductor fins 120 (which may have a (110) crystallographic orientation) is significantly higher than the growth rate on the top surfaces of the semiconductor fins 120 (which may have a (100) crystallographic orientation), thus forming diamond-shaped faceted structures. The epitaxial growth may continue until the epitaxial material on the sidewall surfaces of the adjacent semiconductor fins 120 merge to form a single source/drain region. To increase the difference between the growth rate on (100) surfaces versus (110) and (111) surfaces, a chlorine containing gas such as HCl or $SiH_2Cl_2$ is added to the gases used for the epitaxy process.

In some embodiments, the faceted source/drain regions 150, 152, and 154 may be in-situ doped during epitaxial growth by adding a dopant gas to the source deposition gas (i.e., the Si-containing gas). Exemplary dopant gases may include a boron-containing gas such as $BH_3$ for pFETs or a phosphorus or arsenic containing gas such as $PH_3$ or $AsH_3$ for nFETs, wherein the concentration of impurity in the gas phase determines its concentration in the deposited film. Alternatively, the source/drain regions 150, 152, and 154 can be can be doped ex-situ by ion implantation.

Figure 13:
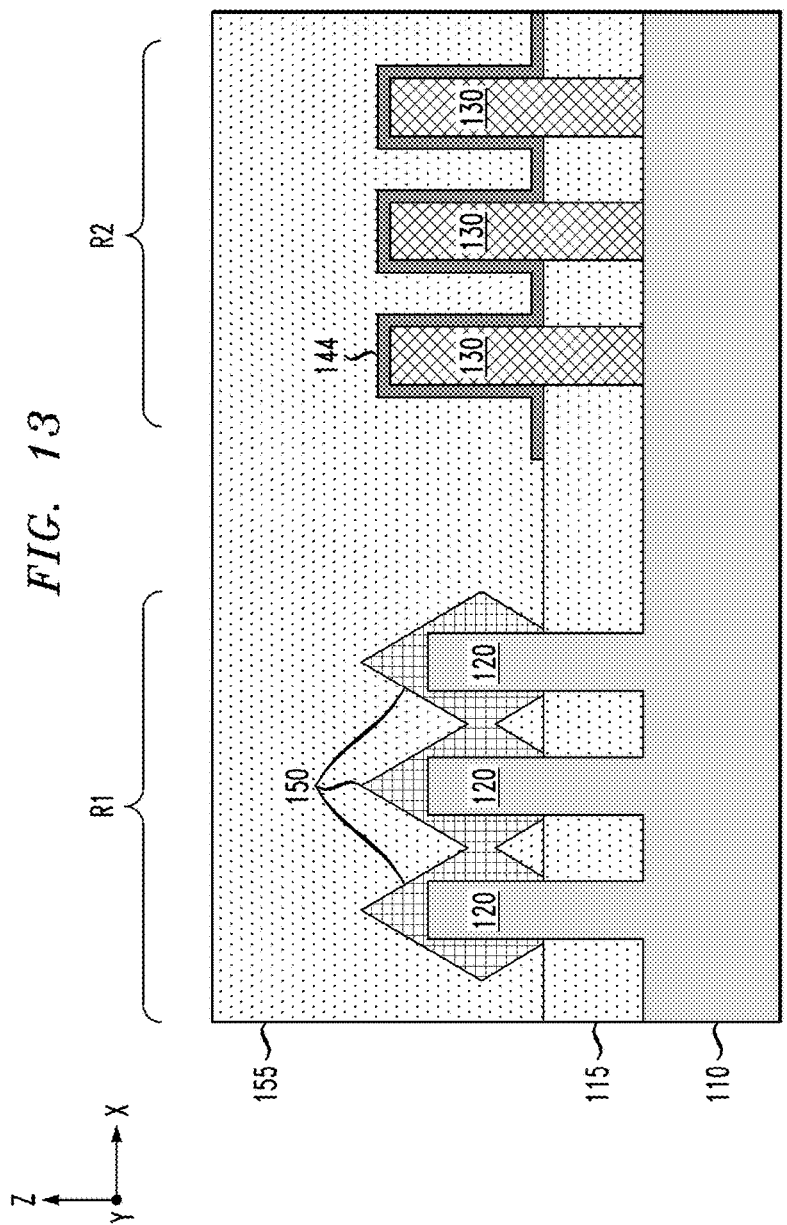

FIG. 13 schematically illustrates a next step in the exemplary fabrication process, which comprises depositing another layer of dielectric/insulating material over the semiconductor structure of FIGS. 12A and 12B, and planarizing the layer of dielectric material down to the upper portion of the insulating spacer layer 144 on the upper surface of the dummy gate structures 140, to form the second layer of insulating material 155. The second layer of insulating material 155 may comprise any suitable insulating/dielectric material that is commonly utilized in FEOL process technologies including, but not limited to, silicon oxide, silicon nitride, SiCOH, SiCH, SiCNH, or other types of silicon-based low-k dielectrics (e.g., k less than about 4.0), porous dielectrics, or known ULK (ultra-low-k) dielectric materials (with k less than about 2.5). The second insulating layer 155 may be deposited using known deposition techniques, such as, for example, ALD, CVD, PECVD, PVD, or spin-on deposition In one embodiment, the second layer of insulating material 155 may be planarized using a standard planarization process such as CMP, wherein the surface of the semiconductor structure is planarized to expose the upper portion of the gate hard mask layer 143 on the upper surface of the dummy gate structures 140. In another embodiment, the CMP process can be performed by planarizing the surface of the semiconductor structure down to expose the dummy poly gate layers 142 of the dummy gate structures 140.

Figure 14A:
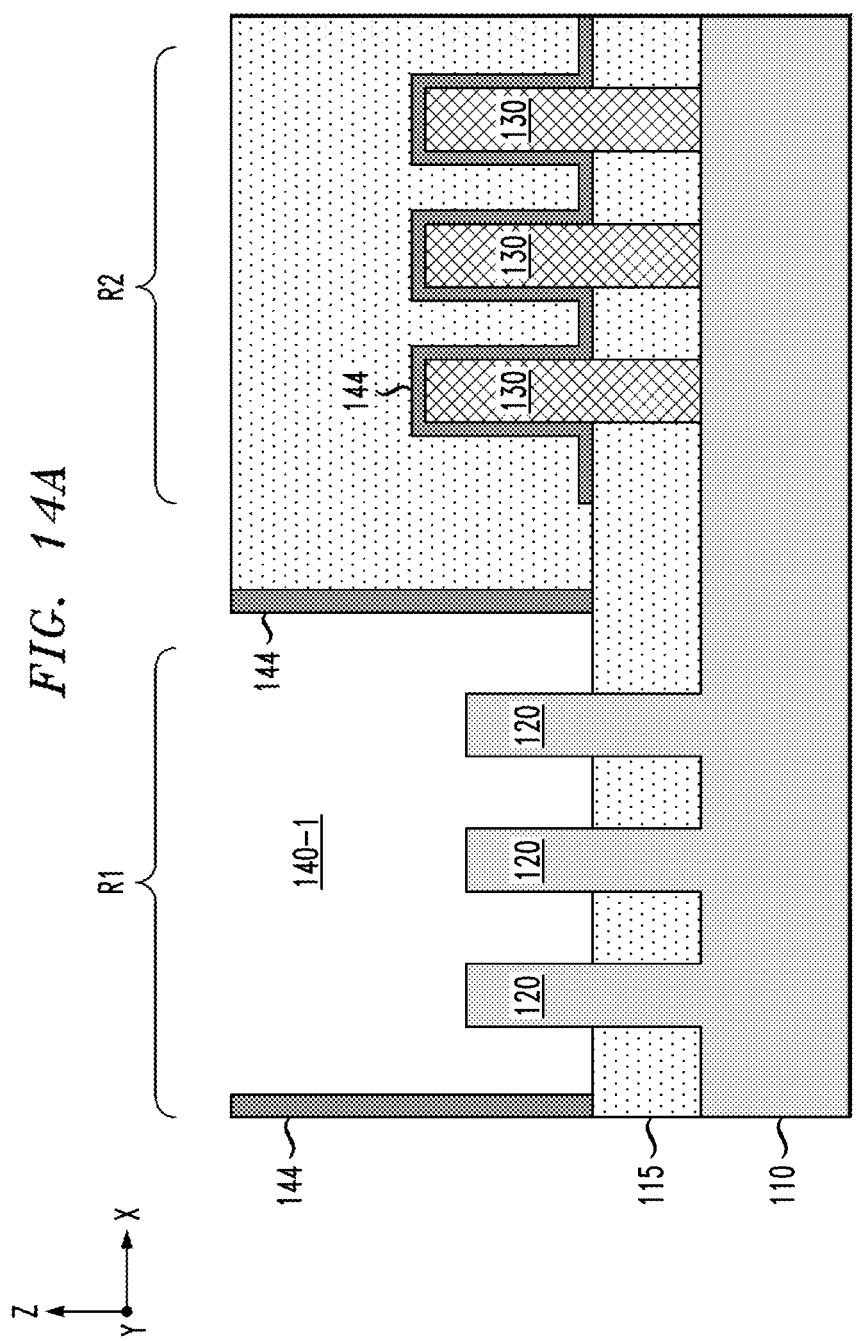
FIG. 14A is a cross-sectional schematic side view of the semiconductor structure of FIG. 13 after removing the dummy gate structures in the first device region.
Figure 14B:
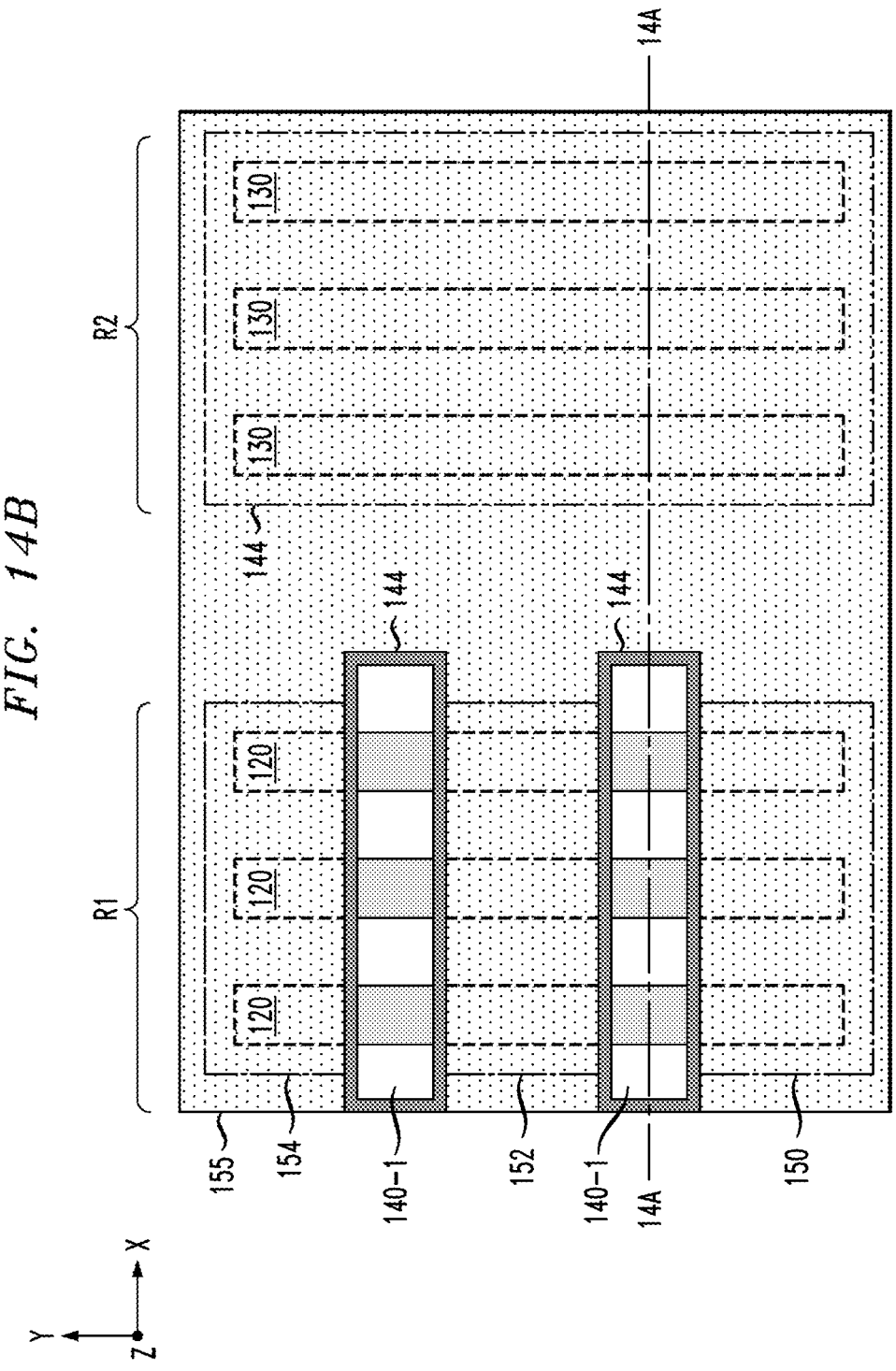

Following planarization of the second layer of insulating material 155, a sequence of etching steps is performed to remove the sacrificial material (dummy poly gate layers 142 and dummy oxide layers 141) of the dummy gate structures 140. For example, FIGS. 14A and 14B are schematic views of the semiconductor structure of FIG. 13 after removing the gate hard mask layer 143 on the upper surface of the dummy gate structures 140. In particular, FIG. 14A is a cross-sectional schematic side view of the semiconductor structure of FIG. 13 after removing the dummy gate structures 140 in the first device region R1. FIG. 14B is a schematic top plan view of the semiconductor structure shown in FIG. 14A, wherein FIG. 14A is a schematic cross-sectional view of the semiconductor structure taken along line 14A-14A in FIG. 14B. As shown in FIGS. 14A and 14B, the dummy gate structures 140 are etched away to form recesses 140-1 between the insulating spacer layers 144, which expose portions of the vertical semiconductor fins 120. The exposed portions of the vertical semiconductor fins 140 within the recesses 140-1 serve as channel regions of the FinFET devices T1 and T2.

For example, in one embodiment of the invention, an etch mask (e.g., photoresist mask) can be formed over the top surface of the semiconductor structure of FIG. 13, which has a pattern that exposes the gate hard mask layers 143 on top of the dummy gate structures 140. The exposed gate hard mask layers 143 on top of the dummy gate structures 140 are then etched away using a suitable etch process and etch chemistry to expose the underlying dummy poly gate layers 142 of the dummy gate structures 140. Another etch process is then performed using a suitable etch process and etch chemistry to remove the dummy poly gate layers 142 selective to the dummy oxide layers 141 on the surfaces of the vertical semiconductor fins 120, thereby forming the recesses 140-1 shown in FIGS. 14A and 14B.

For example, the dummy poly gate layers 142 can be removed using a selective dry etching or wet etching process with suitable etch chemistries, including ammonium hydroxide ($NH_4OH$) or tetramethylammonium hydroxide (TMAH). The etching of the dummy poly gate layers 142 is selective to the insulating/dielectric materials of the second insulating layer 155, the insulating spacer layer 144, and the dummy gate oxide layers 141 formed on the surface of the vertical semiconductor fins 120. During the poly gate etch process, the dummy gate oxide layers 141 protect the vertical semiconductor fins 120 from being etched, as the poly etch process is highly selective to the oxide material of the dummy gate oxide layers 141. After the polysilicon material is removed, an oxide etch process is performed to etch away the dummy gate oxide layers 141 selective to the material of the vertical semiconductor fins 120. In this manner, the sacrificial materials (e.g., dummy polysilicon and oxide layers) of the dummy gate structures 140 can be etched away without damaging the underlying portions of the vertical semiconductor fins 120.

Figure 15:
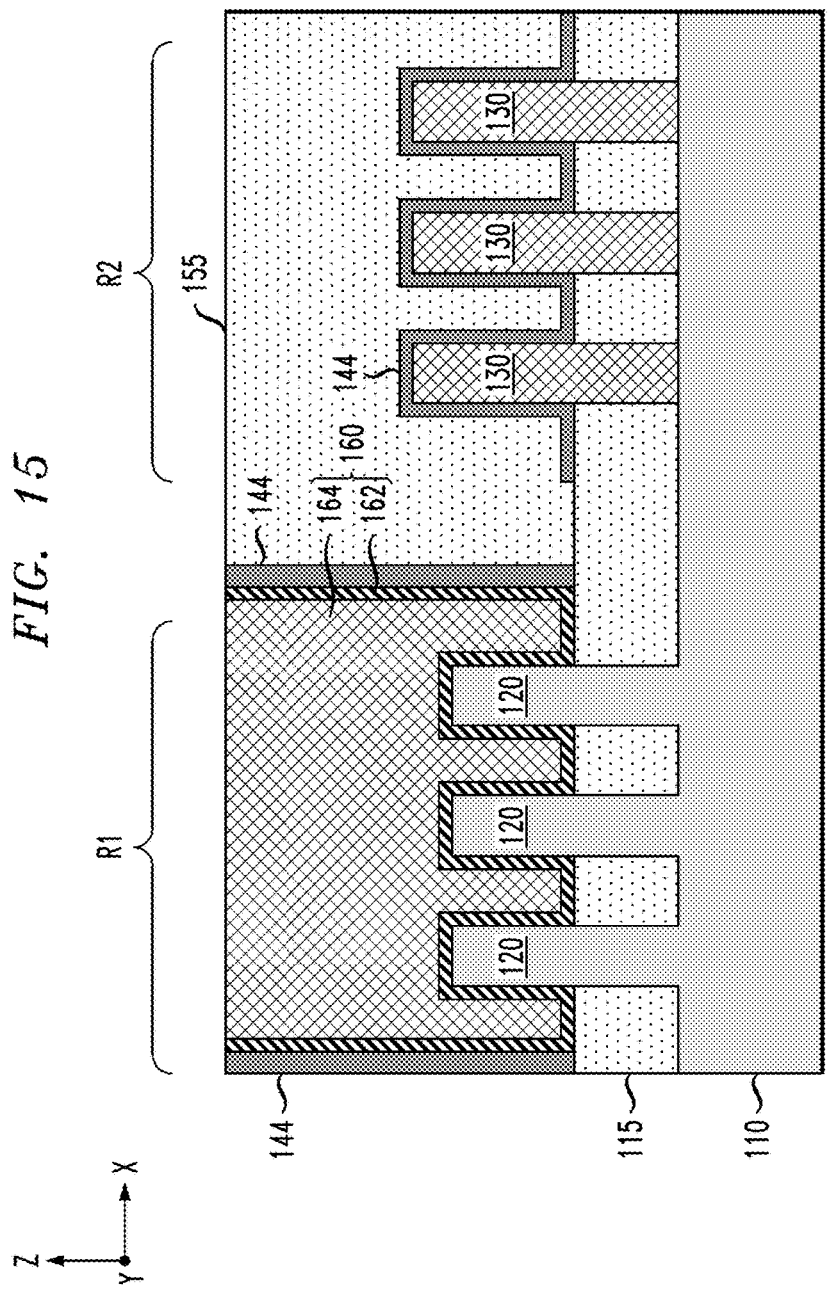

Following removal of the sacrificial material of the dummy gate structures 140, a replacement metal gate process is performed to construct the metal gate structures 160 shown in FIGS. 1A and 1C. For example, FIG. 15 is a cross-sectional schematic side view of the semiconductor structure of FIG. 14A after forming the metal gate structures 160 within the recesses 140-1 between the insulating spacer layer 144, wherein the metal gate structures 160 each comprise a high-k metal gate stack structure 162 and a metal gate electrode layer 164. In one embodiment, the high-k metal gate stack structure 162 comprises a gate dielectric layer and a work function metal layer, wherein the high-k metal gate stack structure 162 is formed by sequentially depositing a conformal layer of gate dielectric material and a conformal layer of work function metal over the semiconductor structure shown in FIG. 14A.

In one embodiment, the layer of gate dielectric material is formed by depositing one or more conformal layers of gate dielectric material over the surface of the semiconductor structure shown in FIGS. 14A and 14B. The gate dielectric material may comprise, e.g., nitride, oxynitride, or oxide or a high-k dielectric material having a dielectric constant of about 3.9 or greater. For example, the conformal gate dielectric material can include a high-k dielectric material, including, but not limited to, $SiO_2$ (k=3.9), $HfO_2$ (k=25), $HfSiO_4$ (k=11), $ZrO_2$ (k=25), $Al_2O_3$ (k=9), $TiO_2$ (k=80), $Ta_2O_5$ (k=22), $La_2O_3$ (k=30), $SrTiO_3$ (k=2000), $LaAlO_3$ (k=30) and combinations thereof. In one embodiment of the invention, the conformal layer of gate dielectric material is formed with a thickness in a range of about 0.5 nm to about 2.5 nm, which will vary depending on the target application. The conformal layer of gate dielectric material is deposited using known methods such as ALD, or CVD, for example.

The conformal layer of work function metal may be formed of one or more types of metallic materials, including, but not limited to, TiN, TaN, TiAlC, Zr, W, Hf, Ti, Al, Ru, Pa, TiAl, ZrAl, WAl, TaAl, HfAl, TiAlC, TaC, TiC, TaMgC, or other work function metals or alloys that are commonly used to obtain target work functions which are suitable for the type of FinFET devices (e.g., n-type or p-type) that are to be formed in the first device region R1. The conformal layer of work function metal is deposited using known methods such as ALD, CVD, etc. In one embodiment, the conformal layer of work function metal is formed with a thickness in a range of about 2 nm to about 5 nm.

After depositing the layers of dielectric and metallic material that form the high-k metal gate stack structures 162, the metal gate electrodes 164 of the metal gate structures 160 are formed by depositing a layer of metallic material to fill the recesses 140-1 with the metallic material. The metal gate electrode layers 164 of the metal gate structures 160 are formed with a conductive material including, but not limited to, W, Al, Ni, Co, or any metallic or conductive material that is commonly used to form metal gate electrode structures. The overburden gate dielectric material, work function metal material, and metal gate electrode material are removed by performing a CMP process to planarize the surface of the semiconductor structure down to the second layer of insulating material 155, resulting in the semiconductor structure shown in FIG. 15.

Figure 16A:
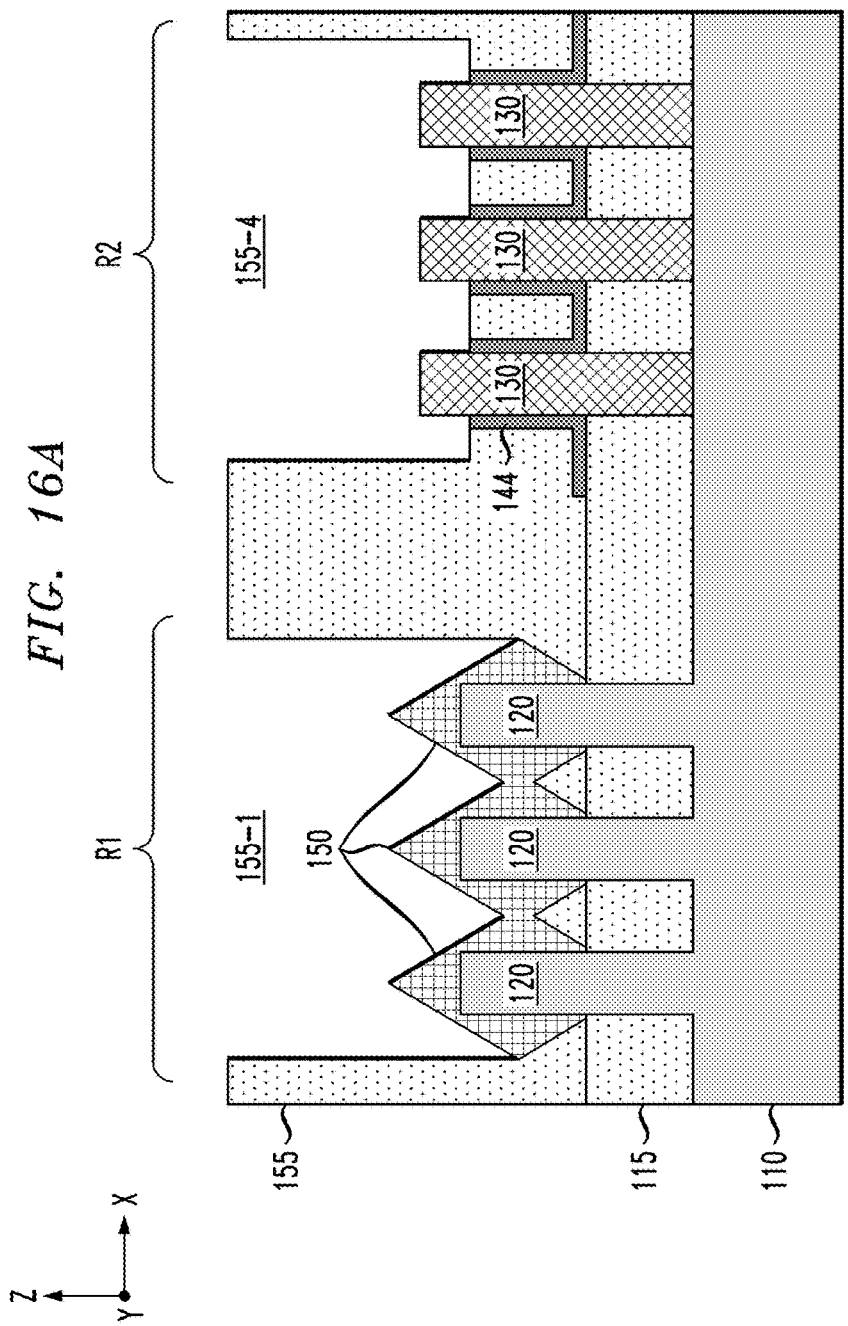
FIG. 16A is a cross-sectional schematic side view of the semiconductor structure of FIG. 15 after patterning the second layer of insulating material to form contact openings down to the epitaxial source/drain regions in the first device region and contact openings down to the end portions of the vertical fin resistor devices in the second device region.
Figure 16B:
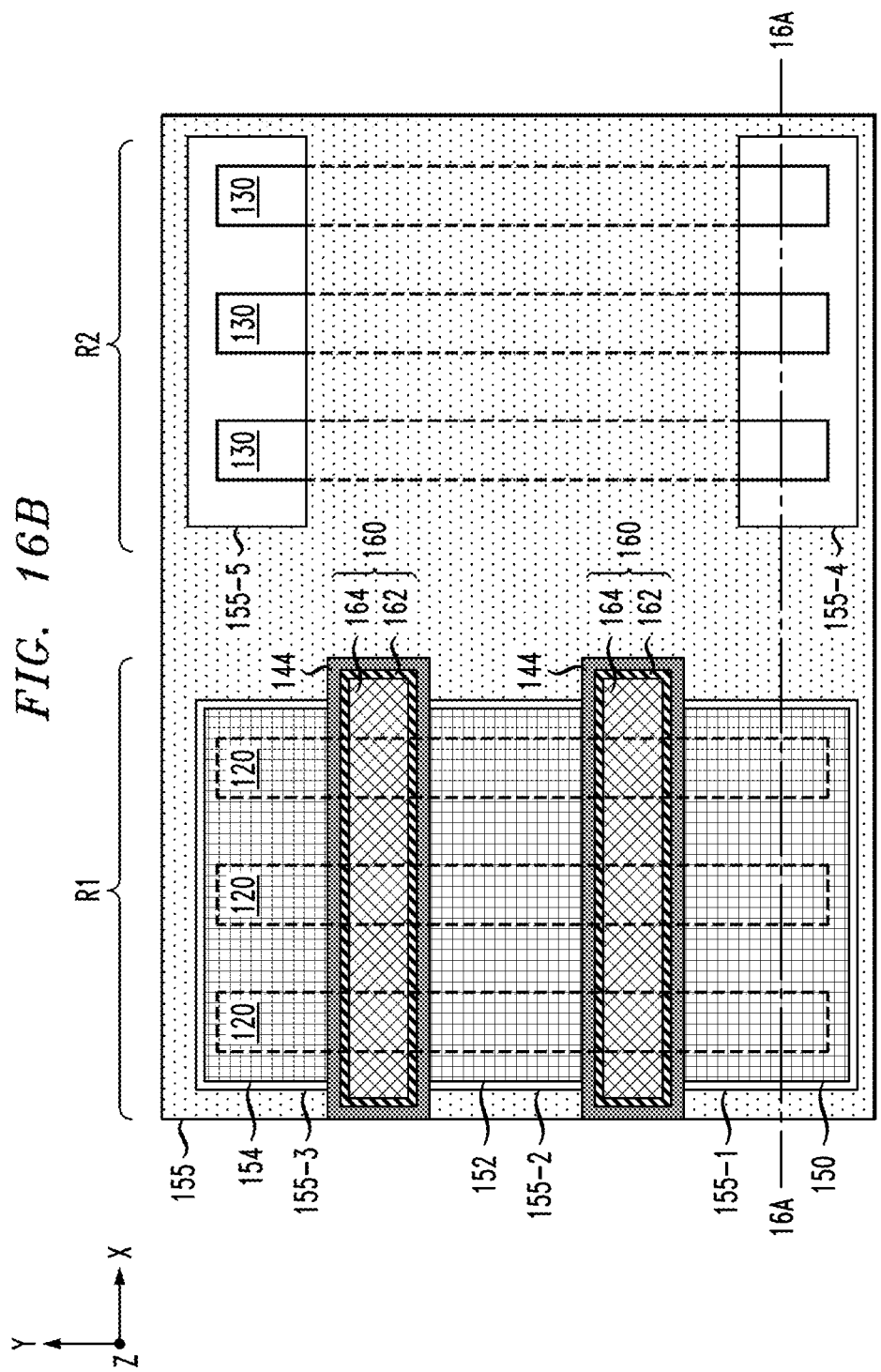

A next stage of the fabrication process comprises etching contact openings in the second layer of insulating material 155, and filling the contact openings with metallic material to form conductive contacts to the FinFET devices T1 and T2 and the vertical fin resistor devices 130 in the device regions R1 and R2. For example, FIGS. 16A and 16B schematically illustrate the semiconductor structure of FIG. 15 after forming a plurality of contact openings 155-1, 155-2, 155-3, 155-4, and 155-5 in the second layer of insulating material 155. FIG. 16B is a schematic top plan view of the semiconductor structure shown in FIG. 16A and FIG. 16A is a schematic cross-sectional view of the semiconductor structure taken along line 16A-16A in FIG. 16B. As collectively shown in FIGS. 16A and 16B, the contact openings 155-1, 155-2 and 155-3 are formed in the second layer of insulating material 155 to expose the respective source/drain regions 150, 152 and 154 in the first device region R1, and the contact openings 154-4 and 155-5 are formed in the second layer of insulating material 155 to expose the end portions of the vertical fin resistor devices 130 in the second device region R2. The contact openings 155-1, 155-2, 155-3, 155-4, and 155-5 are formed in the second layer of insulating material 155 using standard photolithography patterning methods.

After forming the contact openings 155-1, 155-2, 155-3, 155-4, and 155-5, another etch process is performed to etch away the portions of the insulating spacer layer 144 which are exposed through the contact openings 155-4 and 155-5 and thereby expose the upper portions of the vertical fin resistor devices 130. The insulating spacer layer 144 is etched selective to the doped polysilicon material of the vertical fin resistor devices 130 so that the portions of the insulating spacer layer 144 which are exposed through the contact openings 155-4 and 155-5 can be removed without damaging the vertical fin resistor devices 130.

Figure 17:
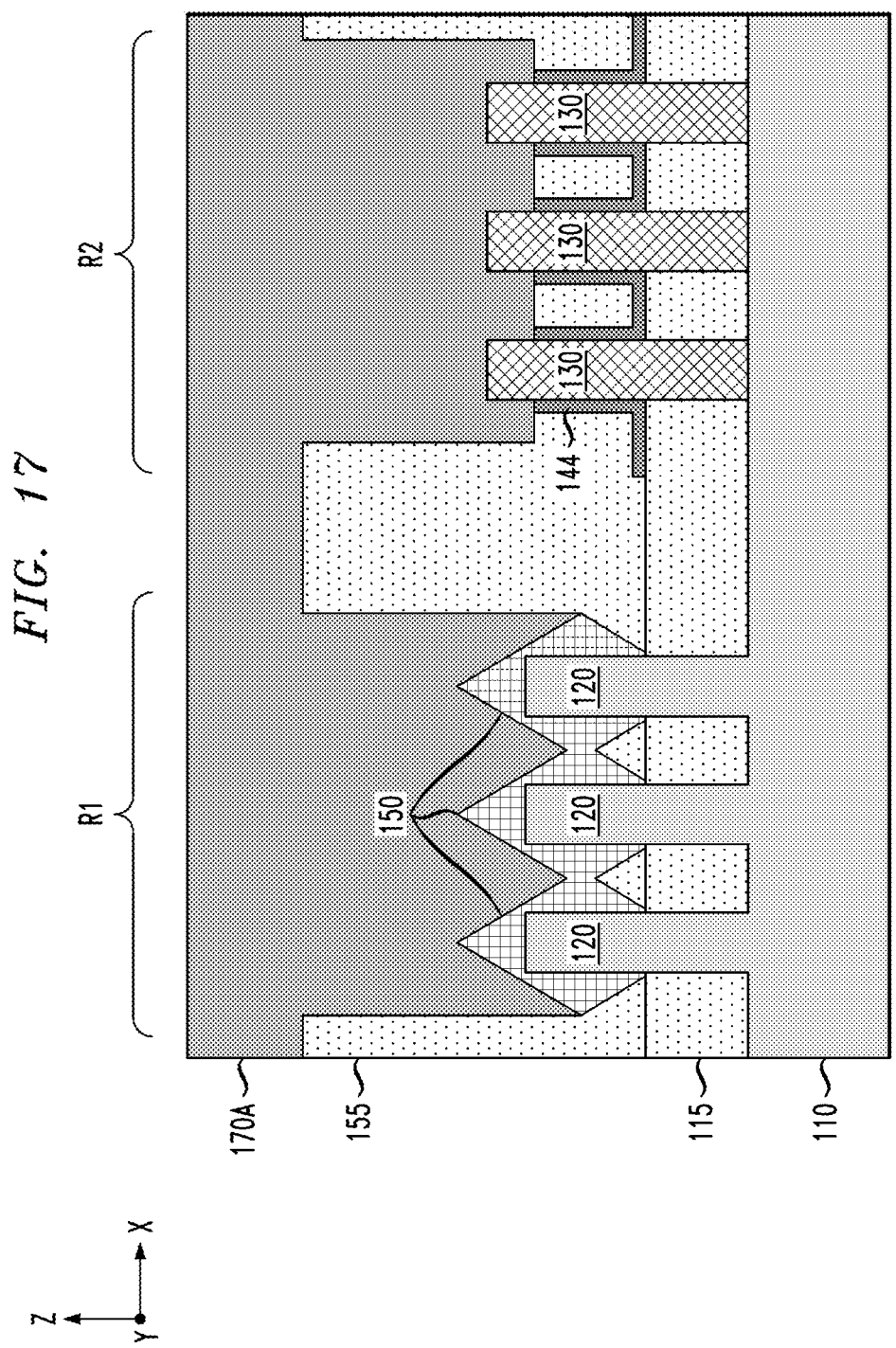
FIG. 17 is a cross-sectional schematic side view of the semiconductor structure of FIG. 16A after depositing a layer of metallic material to fill the contact openings to form vertical source/drain contacts in the first device region and vertical device contacts to the ends of the vertical fin resistor devices in the second device region.

Next, FIG. 17 is a cross-sectional schematic side view of the semiconductor structure of FIG. 16A after depositing a layer of metallic material 170A to fill the contact openings 155-1, 155-2, 155-3, 155-4, and 155-5 with the metallic material. The layer of metallic material 170A may comprise tungsten, cobalt, aluminum, or other conductive materials that are suitable for use in forming vertical device contacts in a MOL layer of the semiconductor device. The semiconductor structure shown in FIG. 17 is planarized down to the second insulating layer 155 to form the vertical source/drain contacts 171, 172, and 173 in the first device region R1 and the vertical device contacts 174 and 175 in the second device region R2, resulting in the semiconductor structure shown in FIGS. 1A, 1B and 1C. Depending on the conductive material used, a thin barrier diffusion layer may be deposited to line the contact openings contact openings 155-1, 155-2, 155-3, 155-4, and 155-5 to insulate the metallic material 170A from the second layer of insulating material 155. However, if the layer metallic material 170A is formed of tungsten, for example, no liner layer may be needed as tungsten is not reactive with the dielectric materials that are typically used to form the second layer of insulating material 155.

Following the formation of the semiconductor structure shown in FIGS. 1A, 1B, and 1C, any known sequence of processing steps can be implemented to complete the fabrication the semiconductor integrated circuit device, the details of which are not needed to understand embodiments of the invention. Briefly, by way of example, MOL processing can continue to form vertical gate contacts to the metal gate structures 160 in the first device region. Following formation of the device contacts (e.g., MOL contacts), a BEOL interconnect structure is formed to provide connections to/between the vertical contacts 171, 172, 173, 174 and 175 of the FinFET devices T1 and T2, the vertical fin resistor devices 130, and other active or passive devices that are formed as part of the FEOL layer.

Figure 18:
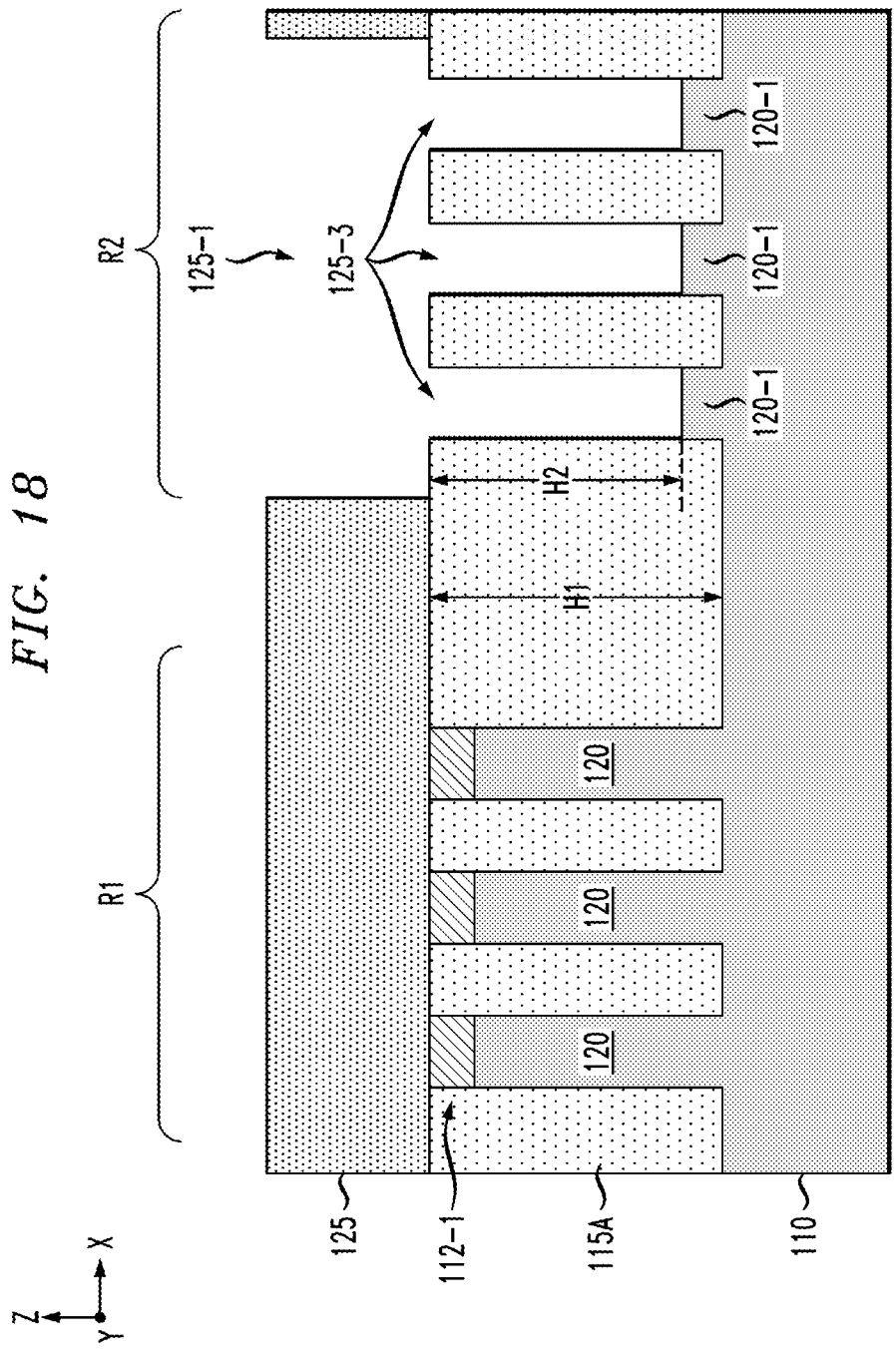
Figure 19:
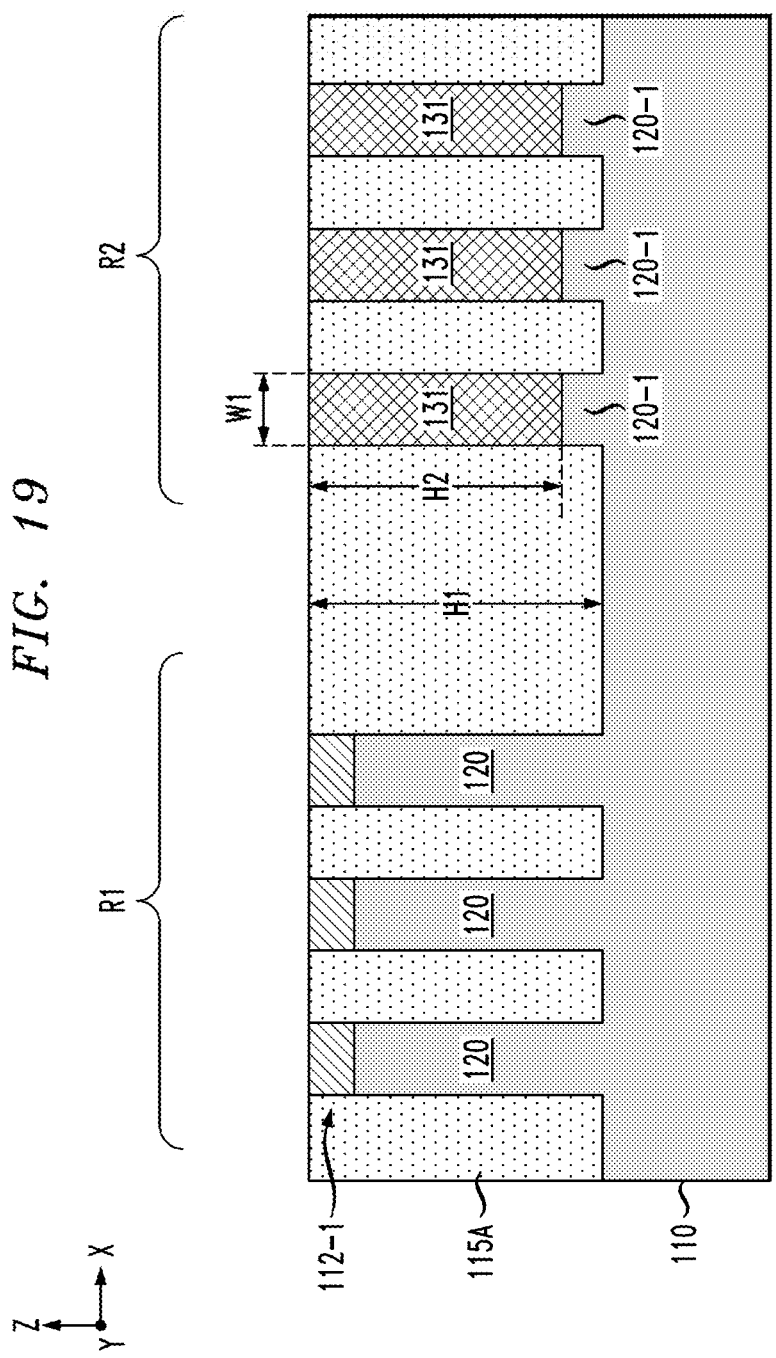

As noted above, embodiments of the invention provide various methods to modify the resistance of vertical fin resistors devices using techniques that will be explained in further detail with reference to FIGS. 18 through 21. For example, FIGS. 18 and 19 schematically illustrate a method for fabricating a semiconductor device having vertical fin resistor devices that are integrated with FinFET devices, according to another embodiment of the invention in which the resistance of the vertical fin resistors devices is adjusted by controlling the height of the vertical fin resistor devices. In particular, FIG. 18 is a cross-sectional schematic side view of the semiconductor structure of FIG. 5 after (i) forming a photoresist mask 125 with an opening 125-1 that exposes the second device region R2, (ii) etching away the portion of the hard mask 112-1 in the second device region R2 to expose the upper surfaces of the vertical semiconductor fins 120 in the second device region R2, and (iii) partially recessing the vertical semiconductor fins in the second device region R to form a plurality of trenches 125-3 in the first layer of insulating material 115A. In the exemplary embodiment of FIG. 18, at the end of the silicon etch process, a portion 120-1 of the vertical semiconductor fins 120 remains at the bottom of the trenches 125-3 resulting in a trench height H2 which is less than the height H1 of the first insulating layer 115A.

Next, FIG. 19 is a cross-sectional schematic side view of the semiconductor structure of FIG. 18 after depositing and planarizing a layer of doped polysilicon material to fill the plurality of trenches 125-3 in the first layer of insulating material 115A with doped polysilicon material to form vertical fin resistor devices 131 in the second device region R2. In the example embodiment of FIG. 19, the height H2 of the vertical fin resistor devices 131 is less than the height H1 of the vertical fin resistor devices 130 as shown in FIG. 8. After forming the semiconductor structure shown in FIG. 19, the fabrication process continues with a process flow as described above with reference to FIGS. 9 through 17.

As compared to the vertical fin resistor devices 130 shown in FIG. 8 which have a cross-sectional area $A=(W1)\times(H1)$, the reduction in the height of the vertical fin resistor devices 131 shown in FIG. 19 results in a decrease of the cross-sectional area $A=(W1)\times(H2)$ of the vertical fin resistor devices 131. As noted above, the cross-sectional area A is perpendicular to the current flow along the length of the vertical fin resistor devices 131 (e.g., length along Y-direction in FIG. 19). A decrease in the cross-sectional area A of the vertical fin resistor devices 131 effectively results in an increase in the resistance of each vertical fin resistor device 131. As such, assuming that the vertical fin devices 131 in FIG. 19 have the same length L1 and are formed of the same doped polysilicon material as the vertical fin devices 130 in FIG. 8, the vertical fin devices 131 would have a greater resistance than the vertical fin devices 130.

Figure 20:
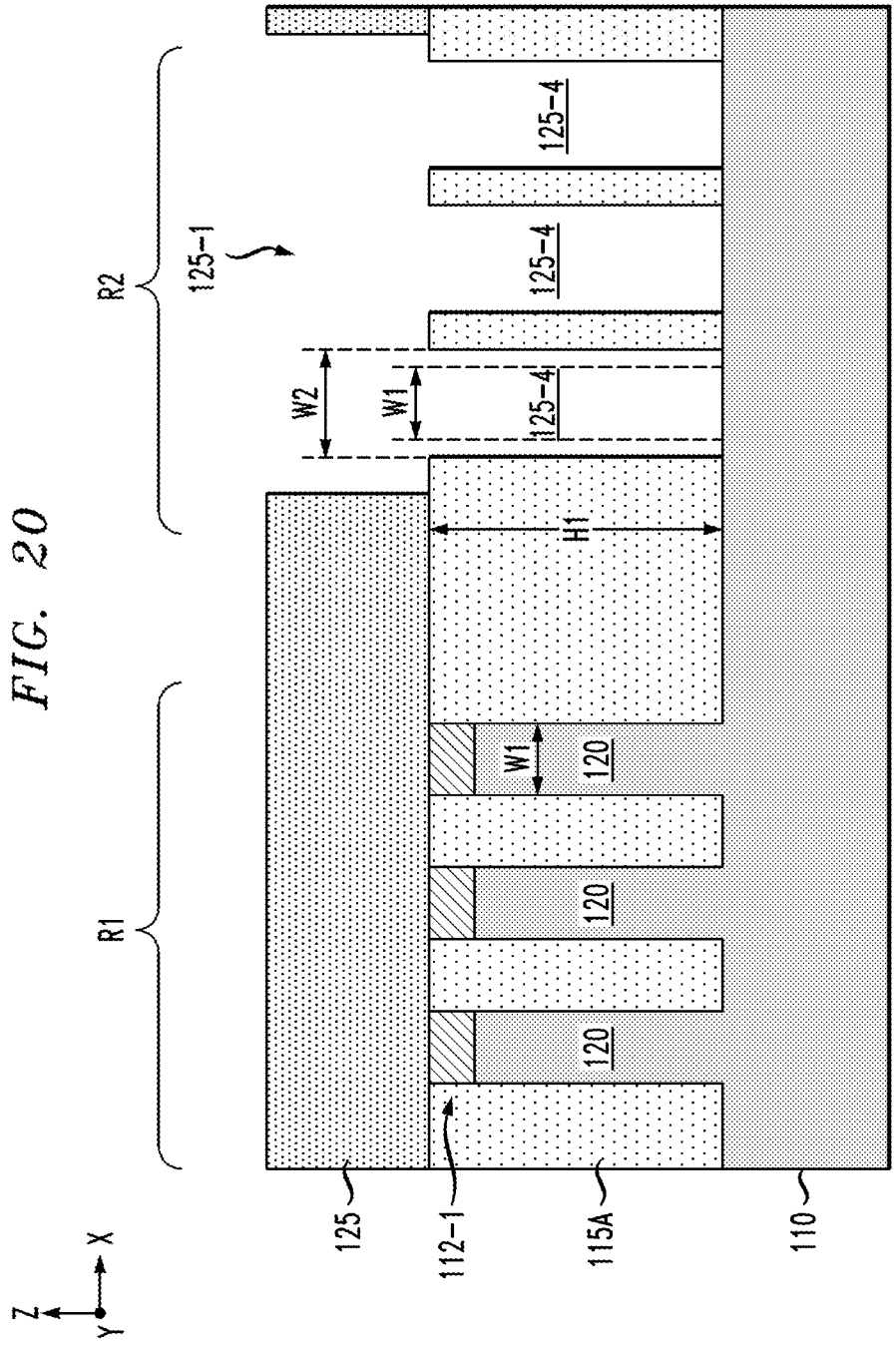
Figure 21:
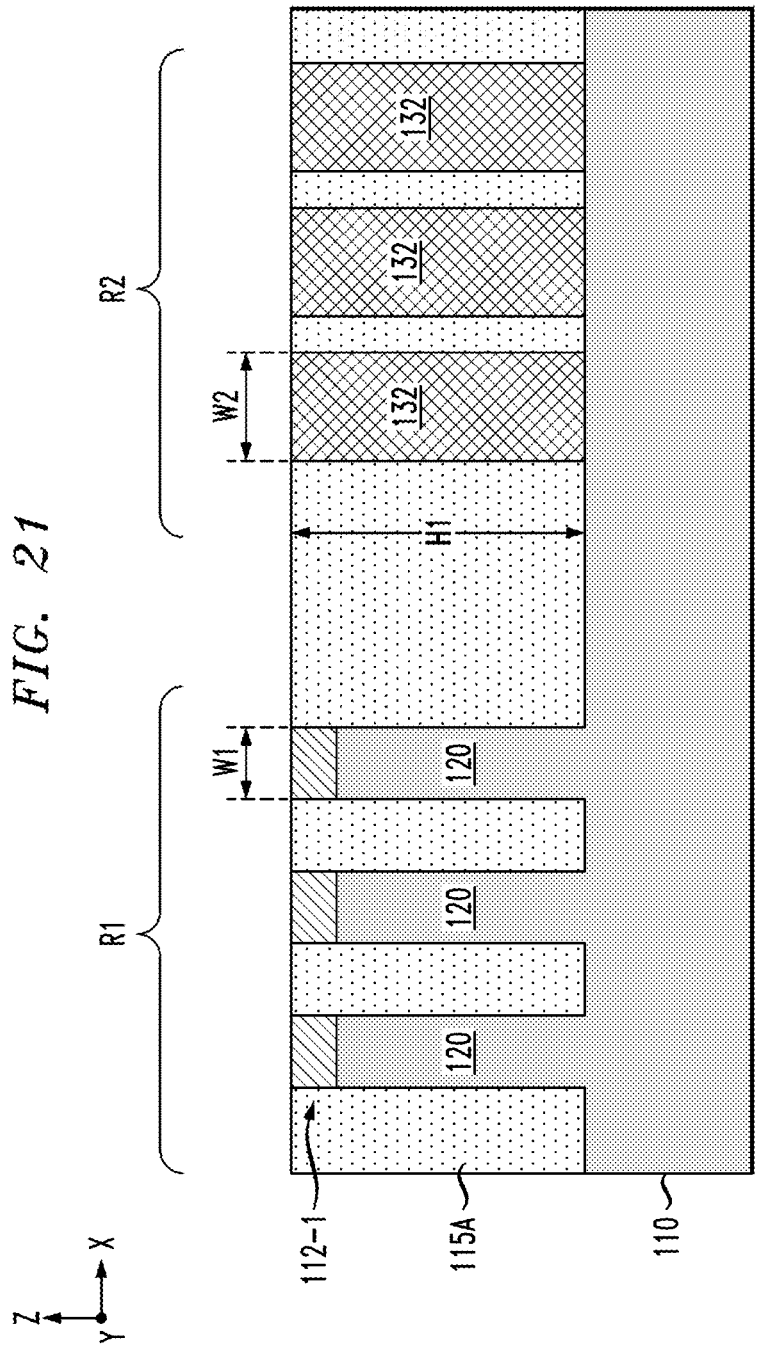

Next, FIGS. 20 and 21 schematically illustrate a method for fabricating a semiconductor device having vertical fin resistor devices that are integrated with FinFET devices, according to yet another embodiment of the invention in which the resistance of the vertical fin devices is adjusted by controlling the width of the vertical fin resistor devices. In particular, FIG. 20 is a cross-sectional schematic side view of the semiconductor structure of FIG. 6 after laterally etching sidewalls of the trenches (e.g., trenches 125-2 of width W1, FIG. 6) to form wider trench openings 125-4 of width W2, as shown in FIG. 20. In the exemplary embodiment of FIG. 20, an isotropic etch process can be performed using a suitable etch process and etch chemistry to laterally etch (e.g., X direction) the sidewall surfaces of the initial trench openings (e.g., trenches 125-2 of width W1, FIG. 6) in the layer of insulating material 115A, and thereby form the wider trenches 125-4 shown in FIG. 20 which have a width W2>W1.

Next, FIG. 21 is a cross-sectional schematic side view of the semiconductor structure of FIG. 19 after depositing and planarizing a layer of doped polysilicon material to fill the plurality of trenches 125-4 in the first layer of insulating material 115A with doped polysilicon material to form vertical fin resistor devices 132 in the second device region R2, wherein the width W2 of the vertical fin resistor devices 132 in the second device region R2 is greater than the width W1 of the vertical semiconductor fins 120 in the first device region R1. After forming the semiconductor structure shown in FIG. 21, the fabrication process continues with a process flow as described above with reference to FIGS. 9 through 17.

As compared to the vertical fin resistor devices 130 shown in FIG. 8 which have a cross-sectional area A=(W1)×(H1), the increase in the width of the vertical fin resistor devices 132 shown in FIG. 21 results in an increase of the cross-sectional area A=(W2)×(H1) of the vertical fin resistor devices 132. The increase in the cross-sectional area A of the vertical fin resistor devices 132 effectively results in a decrease in the resistance of each vertical fin resistor device 132. As such, assuming that the vertical fin devices 132 in FIG. 21 have the same length L and are formed of the same doped polysilicon material as the vertical fin devices 130 in FIG. 8, the vertical fin devices 132 would have a lower resistance than the vertical fin devices 130.

As noted above, embodiments of the invention provide various methods to insulate the vertical fin resistor devices from the substrate 110 to prevent current leakage into the substrate 110. In the example embodiments discussed above, the vertical fin resistor devices 130, 131, 132 are formed in direct contact with the semiconductor substrate 110. In one embodiment, when the semiconductor substrate 110 comprises undoped semiconductor material and the vertical fin resistor devices 130, 131 and 132 are formed of highly doped polysilicon material, current flow through the vertical fin resistor devices 130, 131, and 132 will stay primarily in the doped polysilicon material (low resistance) and not leak into the undoped substrate 110 (high resistance). However, in some applications, depending on the relative resistivity of the materials of the substrate 110 and the vertical fin resistor devices, an interfacial insulating layer can be formed between the vertical fin resistor devices and the substrate 110 to prevent current leakage from the vertical fin resistor devices into the substrate 110 using techniques as schematically illustrated in FIGS. 22 through 25.

Figure 22:
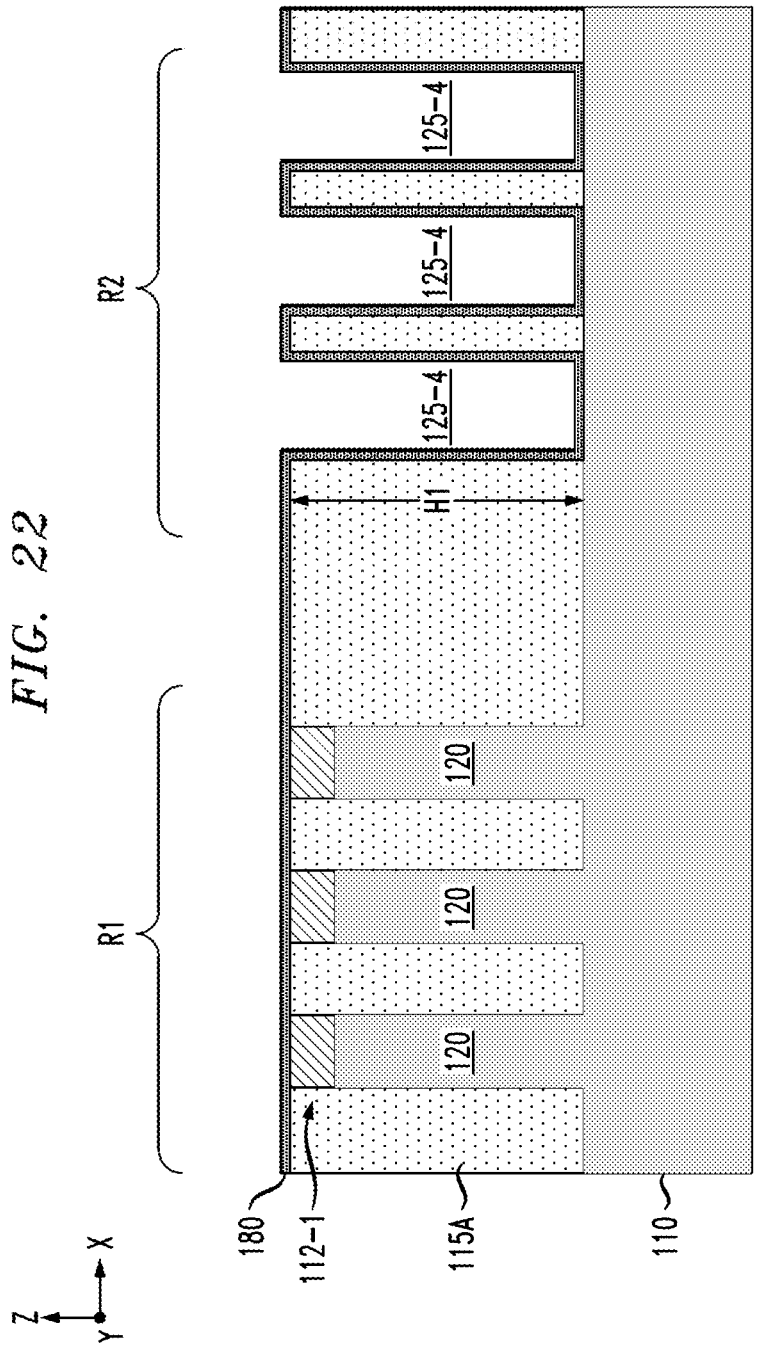
Figure 23:
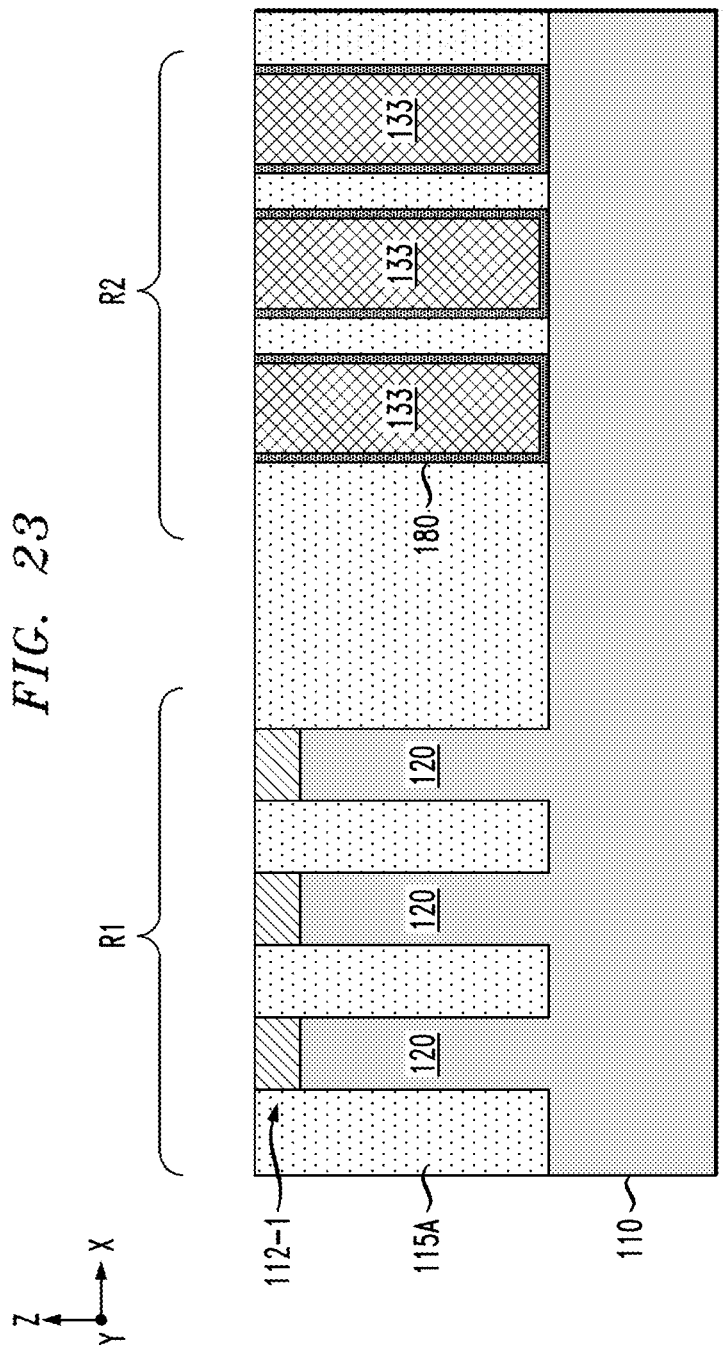

For example, FIGS. 22 and 23 schematically illustrate a method for fabricating a semiconductor device having vertical fin resistor devices that are integrated with FinFET devices, according to another embodiment of the invention in which an interfacial insulating layer is formed between the vertical fin resistor devices and the substrate. In particular, FIG. 22 is a cross-sectional schematic side view of the semiconductor structure of FIG. 20 after depositing a conformal layer of dielectric material 180 to form a thin liner on exposed surfaces within the trenches 125-4. With this method, the initially formed trench openings are widened using an isotropic etching process as schematically illustrated in FIG. 20. The widening of trench openings is an optional step that can be used to ensure that the vertical fin resistor devices have a sufficient width to achieve a target resistance even with insulating material deposited on the sidewalls of the trenches 125-4. The conformal layer of dielectric material 180 can be formed using any dielectric material, such as SiN, which is suitable for the given application.

Next, FIG. 23 is a cross-sectional schematic side view of the semiconductor structure of FIG. 22 after depositing and planarizing a layer of doped polysilicon material to fill the plurality of trenches 125-4 in the first layer of insulating material 115A with doped polysilicon material and thereby form vertical fin resistor devices 133 in the second device region R2. With this process, the overburden dielectric material 180 and doped polysilicon material on the upper surface of the first layer of insulating material 115A is removed via CMP, resulting in the semiconductor structure shown in FIG. 23. As shown in FIG. 23, the vertical fin resistor devices 133 are insulated from the substrate 110 and the insulating layer 115A by thin liner layers 180. After forming the semiconductor structure shown in FIG. 23, the fabrication process continues with a process flow as described above with reference to FIGS. 9 through 17.

Figure 24:
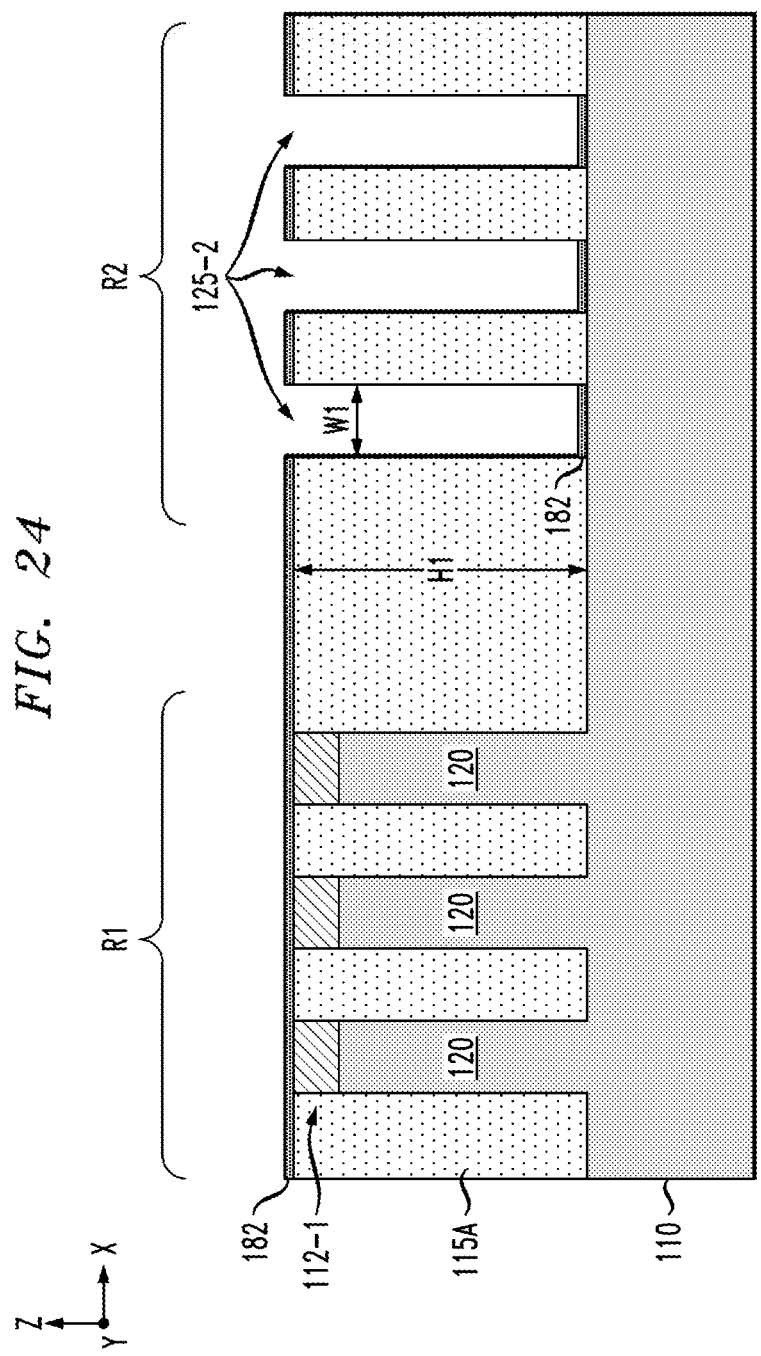
Figure 25:
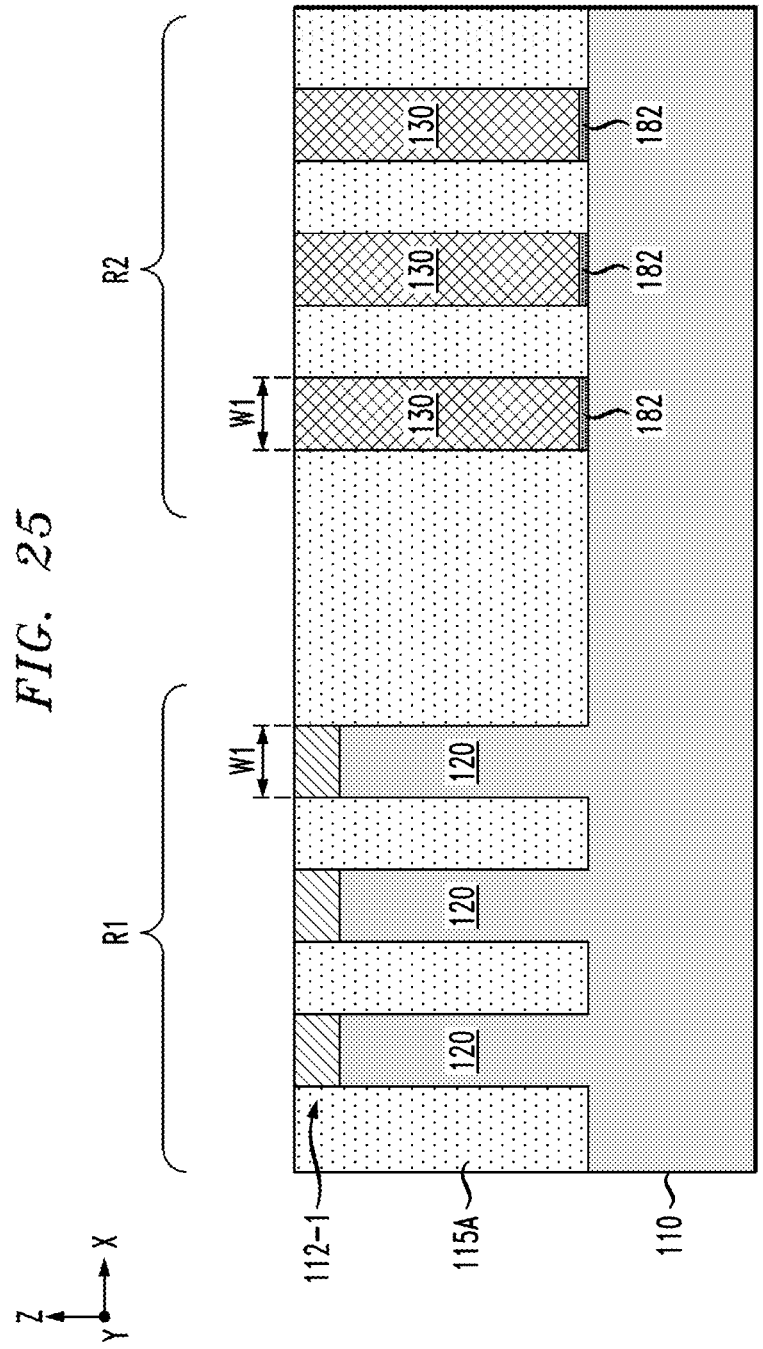

Next, FIGS. 24 and 25 schematically illustrate a method for fabricating a semiconductor device having vertical fin resistor devices that are integrated with FinFET devices, according to yet another embodiment of the invention in which an interfacial insulating layer is formed between the vertical fin resistor devices and the substrate. In particular, FIG. 24 is a cross-sectional schematic side view of the semiconductor structure of FIG. 6 after removing the photoresist mask 125 and selectively depositing a layer of dielectric material 182 on bottom surfaces of the trenches 125-2. In this embodiment, a directional deposition process (e.g., Gas Cluster Ion Beam (GCM)) is implemented to primarily deposit dielectric material on the lateral surfaces of the semiconductor structure (e.g., at the bottom surfaces of the trench openings 125-2), which limits or prevents the deposition of dielectric material on the vertical surfaces (e.g., sidewall surfaces of the trench openings 125-2) and decreasing the width of the trenches 125-2. With this process, the original width W1 of the trench openings remains substantially the same, as the width W' of the trench openings 125-2 is not decreased by dielectric material being formed on the sidewalls of the trench openings 125-2.

Next, FIG. 25 is a cross-sectional schematic side view of the semiconductor structure of FIG. 24 after depositing and planarizing a layer of doped polysilicon material to fill the plurality of trenches 125-2 in the first layer of insulating material 115A with doped polysilicon material to form the vertical fin resistor devices 130 in the second device region R2. The semiconductor structure shown in FIG. 25 is essentially the same as the semiconductor structure shown in FIG. 8 except that in FIG. 25, a thin interfacial insulating layer 182 is disposed at the bottom of the trench openings 125-2 to electrically insulate the vertical fin resistor devices 130 from the substrate 110. After forming the semiconductor structure shown in FIG. 25, the fabrication process continues with a process flow as described above with reference to FIGS. 9 through 17.

It is to be understood that the methods discussed herein for fabricating vertical fin resistor devices and FinFET devices can be incorporated within semiconductor processing flows for fabricating other types of semiconductor devices and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

What is claimed is:

1. A method for fabricating a semiconductor device, comprising:
    forming a plurality of vertical semiconductor fins on a semiconductor substrate, the plurality of vertical semiconductor fins comprising a first vertical semiconductor fin and a second vertical semiconductor fin;
    forming a first insulating layer over the semiconductor substrate to encapsulate the plurality of vertical semiconductor fins in the first insulating layer;
    etching down the second vertical semiconductor fin to form a trench opening in the first insulating layer;
    forming a vertical fin resistor device in the trench opening of the first insulating layer by filling the trench opening with a resistive material;
    forming a FinFET (Fin Field Effect Transistor) device which comprises a metal gate structure formed over a portion of the first vertical semiconductor fin, and first and second source/drain regions formed on portions of the first vertical semiconductor fin extending from opposite sides of the metal gate structure;
    wherein forming the FinFET device comprises:
    recessing the first insulating layer down to a target level to expose an upper portion of the first vertical semiconductor fin and to expose an upper portion of the vertical fin resistor device, after forming the vertical fin resistor device;
    forming a dummy gate structure over the exposed upper portion of the vertical semiconductor fin;
    forming a conformal insulating spacer layer on the dummy gate structure and the exposed upper portion of the vertical fin resistor device;
    forming the first and second source/drain regions of the FinFET device by epitaxially growing semiconductor material on the exposed upper portions of the first vertical semiconductor fin which extend from opposite sides of the dummy gate structure; and
    performing a replacement metal gate process to replace the dummy gate structure with the metal gate structure.

2. The method of claim 1, wherein forming the plurality of vertical semiconductor fins on the semiconductor substrate comprises patterning an active semiconductor surface of the semiconductor substrate to form the first and second vertical semiconductor fins in the surface of the semiconductor substrate.

3. The method of claim 1, wherein the resistive material comprises at least one of polysilicon and amorphous silicon.

4. The method of claim 1, wherein etching down the second vertical semiconductor fin to form the trench opening in the first insulating layer comprises completely removing the second vertical semiconductor fin.

5. The method of claim 1, wherein etching down the second vertical semiconductor fin to form the trench opening in the first insulating layer comprises partially removing the second vertical semiconductor fin such that a portion of the second vertical semiconductor fin remains at the bottom of the trench opening.

6. The method of claim 1, further comprising depositing a conformal layer of insulating material to line sidewall and bottom surfaces of the trench opening, before filling the trench opening with the resistive material.

7. The method of claim 1, further comprising depositing a layer of insulating material on a bottom surface of the trench opening, before filling the trench opening with the resistive material.

8. The method of claim 1, further comprising laterally etching sidewalls of the trench opening in the first insulating layer to increase a width of the trench opening, before filling the trench opening with the resistive material.

9. The method of claim 8, further comprising depositing a conformal layer of insulating material to line sidewall and bottom surfaces of the trench opening, before filling the trench opening with the resistive material.

10. A semiconductor device, comprising:
    a FinFET (Fin Field Effect Transistor) device formed on a semiconductor substrate, wherein the FinFET device comprises:
        a vertical semiconductor fin formed on the semiconductor substrate, wherein the vertical semiconductor fin comprises a structural profile that is defined by dimensions of width W, height H, and length L;
        a gate structure formed over a portion of the vertical semiconductor fin; and
        first and second source/drain regions formed on portions of the vertical semiconductor fin extending from opposite sides of the gate structure; and
    a vertical fin resistor device formed on the semiconductor substrate,
    wherein vertical fin resistor device comprises a vertical fin structure formed of a resistive material, wherein the vertical fin structure comprises a structural profile that is defined by dimension of width W1, height H1, and length L1;
    wherein W1 is greater than W.

11. The semiconductor device of claim 10, wherein L and L1 are substantially the same.

12. The semiconductor device of claim 10, wherein H and H1 are substantially the same, and wherein L and L1 are substantially the same.

13. The semiconductor device of claim 10, wherein H is greater than H1.

14. The semiconductor device of claim 10, wherein the resistive material comprises at least one of polysilicon and amorphous silicon.

15. The semiconductor device of claim 10, further comprising an insulating layer disposed between the semiconductor substrate and the vertical fin structure of the vertical fin resistor device.

16. The semiconductor device of claim 10, wherein the gate structure of the FinFET device comprises a high-k metal gate stack structure and a metal gate electrode layer, wherein the high-k metal gate stack structure comprises a gate dielectric layer formed of a dielectric material with k greater than about 3.9, and a work function metal layer.

17. The semiconductor device of claim 10, wherein the vertical fin resistor device comprises a plurality of vertical fin structures that are parallel connected.

18. The semiconductor device of claim 17, further comprising a first vertical device contact which is commonly connected to first ends of the plurality of vertical fin structures, and a second vertical device contact which is commonly to second ends of the plurality of vertical fin structures.

19. A method for fabricating a semiconductor device, comprising:
   forming a plurality of vertical semiconductor fins on a semiconductor substrate, the plurality of vertical semiconductor fins comprising a first vertical semiconductor fin and a second vertical semiconductor fin;
   forming a first insulating layer over the semiconductor substrate to encapsulate the plurality of vertical semiconductor fins in the first insulating layer;
   etching down the second vertical semiconductor fin to form a trench opening in the first insulating layer;
   laterally etching vertical sidewalls of the first insulating layer within the trench opening to increase a width of the trench opening in the first insulating layer and form a widened trench opening;
   forming a vertical fin resistor device in the widened trench opening of the first insulating layer by filling the widened trench opening with a resistive material; and
   forming a FinFET (Fin Field Effect Transistor) device which comprises a metal gate structure formed over a portion of the first vertical semiconductor fin, and first and second source/drain regions formed on portions of the first vertical semiconductor fin extending from opposite sides of the metal gate structure.

20. The method of claim 19, wherein the resistive material comprises at least one of polysilicon and amorphous silicon.

* * * * *